US012608518B2

(12) United States Patent
Torigoe et al.

(10) Patent No.: US 12,608,518 B2
(45) Date of Patent: *Apr. 21, 2026

(54) MULTI-AGENT SIMULATION SYSTEM

(71) Applicant: TOYOTA JIDOSHA KABUSHIKI KAISHA, Toyota (JP)

(72) Inventors: Takatomo Torigoe, Yokohama (JP); Akira Yoshioka, Tokyo-to (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 944 days.

This patent is subject to a terminal disclaimer.

(21) Appl. No.: 17/804,482

(22) Filed: May 27, 2022

(65) Prior Publication Data

US 2022/0391559 A1 Dec. 8, 2022

(30) Foreign Application Priority Data

Jun. 8, 2021 (JP) ................................. 2021-095951

(51) Int. Cl.
    *G06F 30/20* (2020.01)
(52) U.S. Cl.
    CPC .................................... *G06F 30/20* (2020.01)
(58) Field of Classification Search
    CPC ....................................................... G06F 30/20
    USPC .............................................................. 703/6
    See application file for complete search history.

(56) References Cited

U.S. PATENT DOCUMENTS

| | | | | |
|---|---|---|---|---|
| 8,027,817 | B2 * | 9/2011 | Dillenberger | ......... G06F 9/5072 |
| | | | | 709/224 |
| 8,260,739 | B1 * | 9/2012 | Pelletier | .............. G05B 19/042 |
| | | | | 700/32 |
| 9,128,748 | B2 * | 9/2015 | Mizrachi | .............. G06F 30/367 |
| 9,251,308 | B2 * | 2/2016 | Kajitani | .................. G06F 30/15 |
| 9,336,481 | B1 | 5/2016 | Ionson | |
| 11,036,903 | B2 * | 6/2021 | Basin | ...................... G06F 30/20 |
| 11,087,633 | B2 * | 8/2021 | Delisle | .................... H04L 67/10 |
| 11,314,907 | B2 * | 4/2022 | Phatak | .................... G06F 30/20 |

(Continued)

FOREIGN PATENT DOCUMENTS

| | | |
|---|---|---|
| JP | H10312369 A | 11/1998 |
| JP | 2004272693 A | 9/2004 |

(Continued)

OTHER PUBLICATIONS

Logan et al. ("The Distributed Simulation of Multiagent Systems", IEEE, 2001, pp. 174-185) (Year: 2001).*

(Continued)

*Primary Examiner* — Iftekhar A Khan
(74) *Attorney, Agent, or Firm* — Dickinson Wright, PLLC

(57) ABSTRACT

A multi-agent simulation system performs a simulation of a target world in which a plurality of agents interacting with each other exist. The multi-agent simulation system includes: a plurality of agent simulators configured to perform simulations of the plurality of agents, respectively; and a center controller configured to communicate with the plurality of agent simulators. The center controller performs message filtering based on a processing time interval of each agent simulator. More specifically, the center controller sets the number of the delivery message delivered per unit time to the agent simulator whose processing time interval is relatively long to be relatively small.

5 Claims, 19 Drawing Sheets

(56) References Cited

U.S. PATENT DOCUMENTS

| | | | | |
|---|---|---|---|---|
| 11,595,481 | B2 | 2/2023 | Torigoe et al. | |
| 11,736,571 | B2 | 8/2023 | Torigoe et al. | |
| 11,743,341 | B2 | 8/2023 | Torigoe et al. | |
| 2005/0095572 | A1* | 5/2005 | Comer | G09B 7/02 |
| | | | | 434/362 |
| 2006/0282248 | A1* | 12/2006 | Kageyama | G06F 30/20 |
| | | | | 703/13 |
| 2011/0054874 | A1* | 3/2011 | Ikeda | G06N 3/006 |
| | | | | 711/170 |
| 2011/0077926 | A1* | 3/2011 | Amthor | G05B 19/4069 |
| | | | | 703/6 |
| 2011/0161063 | A1 | 6/2011 | Pye | |
| 2012/0203528 | A1* | 8/2012 | Ikeda | G06F 30/15 |
| | | | | 703/8 |
| 2012/0331035 | A1* | 12/2012 | Pelletier | H04W 12/037 |
| | | | | 709/202 |
| 2015/0085691 | A1* | 3/2015 | Custer | H04W 16/22 |
| | | | | 370/252 |
| 2016/0132778 | A1 | 5/2016 | Hayashi | |
| 2016/0189558 | A1* | 6/2016 | McGann | G09B 5/06 |
| | | | | 434/219 |
| 2017/0236431 | A1* | 8/2017 | Delisle | G06Q 10/10 |
| | | | | 434/362 |
| 2018/0060456 | A1* | 3/2018 | Phatak | G06F 9/5077 |
| 2018/0268624 | A1* | 9/2018 | Remboski | B60W 50/0097 |
| 2020/0306643 | A1 | 10/2020 | Borovikov | |
| 2020/0353943 | A1* | 11/2020 | Siddiqui | G06T 7/20 |
| 2021/0104171 | A1* | 4/2021 | White | G06F 30/20 |
| 2021/0374310 | A1* | 12/2021 | Basin | G06F 16/285 |
| 2022/0058012 | A1* | 2/2022 | Kaushik | H04L 63/029 |
| 2022/0126864 | A1* | 4/2022 | Moustafa | B60W 60/0013 |
| 2022/0130546 | A1* | 4/2022 | Wei | G06N 3/092 |
| 2022/0156432 | A1* | 5/2022 | Best | G06F 30/20 |
| 2023/0035281 | A1 | 2/2023 | Best | |
| 2023/0367923 | A1* | 11/2023 | Yang | H04L 9/3247 |

FOREIGN PATENT DOCUMENTS

| | | | | | |
|---|---|---|---|---|---|
| JP | 2006079341 | A | | 3/2006 | |
| JP | 2007047972 | A | | 2/2007 | |
| JP | 2008203913 | A | | 9/2008 | |
| JP | 2009043077 | A | | 2/2009 | |
| JP | 2009151634 | A | | 7/2009 | |
| JP | 2011248600 | A | * 12/2011 | | G06F 9/50 |
| JP | 2015022378 | A | | 2/2015 | |
| JP | 0685906 | B2 | | 3/2015 | |
| JP | 5685906 | B2 | | 3/2015 | |
| WO | 2011018854 | A1 | | 2/2011 | |

OTHER PUBLICATIONS

Xu et al. ("Controller Synthesis for Multi-Agent Systems With Intermittent Communication: A Metric Temporal Logic Approach", IEEE, 2019, pp. 1015-1022) (Year: 2019).*

IEEE Standard for Modeling and Simulation (M&S) High Level Architecture (HLA)—Federate Interface Specification , USA , IEEE , Aug. 2010 , pp. 25-27.

Takatomo Torigoe et al., U.S. Appl. No. 17/662,164, filed May 5, 2022.

Takatomo Torigoe et al., U.S. Appl. No. 17/662,164, Non-Final Office Action dated May 30, 2023.

Takatomo Torigoe et al., U.S. Appl. No. 17/662,164, Notice of Allowance dated Jun. 13, 2023.

Takatomo Torigoe et al., U.S. Appl. No. 17/662,166, filed May 5, 2022.

Takatomo Torigoe et al., U.S. Appl. No. 17/662,166, Non-Final Office Action dated Mar. 1, 2023.

Takatomo Torigoe et al., U.S. Appl. No. 17/662,166, Notice of Allowance dated May 30, 2023.

Takatomo Torigoe et al., U.S. Appl. No. 17/664,558, filed May 23, 2022.

Takatomo Torigoe et al., U.S. Appl. No. 17/664,558, Notice of Allowance dated Dec. 21, 2022.

* cited by examiner

*FIG. 16*

MULTI-AGENT SIMULATION SYSTEM

CROSS-REFERENCE TO RELATED APPLICATION

This application claims priority to Japanese Patent Application No. 2021-095951 filed on Jun. 8, 2021, the entire contents of which are incorporated by reference herein.

BACKGROUND

Technical Field

The present disclosure relates to a multi-agent simulation technique that performs a simulation of a target world in which a plurality of agents interacting with each other exist.

Background Art

Patent Literature 1 discloses a distributed simulation system in which a plurality of simulators exchange data via a network to perform a simulation. The distributed simulation system is provided with a distributed simulation control device that controls the data exchange between the plurality of simulators. The distributed simulation control device monitors data update in each simulator, and notifies each simulator of contents of the data update. Each simulator monitors the date update in other simulators notified from the distributed simulation control device. When data retained by a subject simulator is updated in another simulator, access to the data retained by the subject simulator is restricted. When referring to the limited-access data, the subject simulator imports the data updated in the other simulator to update the data retained by the subject simulator.

Patent Literature 2 and Patent Literature 3 are documents indicating technical levels of the technical field of the present disclosure at the time of filing.

LIST OF RELATED ART

Patent Literature 1: Japanese Laid-Open Patent Application Publication No. JP-H10-312369
Patent Literature 2: Japanese Laid-Open Patent Application Publication No. JP-2006-079341
Patent Literature 3: Japanese Laid-Open Patent Application Publication No. JP-2009-043077

SUMMARY

A multi-agent simulation that simulates a target world in which a plurality of agents interacting with each other exist is considered. In the multi-agent simulation, there are a plurality of agent simulators that respectively perform simulations of the plurality of agents, and messages are exchanged between the plurality of agent simulators. For that purpose, there is a center controller intervening between the plurality of agent simulators. The center controller communicates with each agent simulator, and delivers (forwards) a message received from an agent simulator to other agent simulators. In such the configuration, when all messages are delivered from the center controller to each agent simulator, a traffic from the center controller to the agent simulators as a whole is increased. Unnecessary increase in the traffic leads to unnecessary consumption of communication resources.

An object of the present disclosure is to provide a technique that can suppress unnecessary increase in traffic in a multi-agent simulation.

An aspect of the present disclosure is directed to a multi-agent simulation system that performs a simulation of a target world in which a plurality of agents interacting with each other exist.

The multi-agent simulation system includes:
a plurality of agent simulators configured to perform simulations of the plurality of agents, respectively; and
a center controller configured to communicate with the plurality of agent simulators.

A subject agent is the agent allocated for each of the plurality of agent simulators.

The center controller is further configured to deliver at least one delivery message indicating a status of at least one another agent different from the subject agent to the each agent simulator.

The each agent simulator is configured to:
determine a status of the subject agent by performing a simulation of the subject agent based on the status of said another agent indicated by the delivery message; and
send a result message indicating the status of the subject agent acquired as a result of the simulation to the center controller.

The center controller is further configured to deliver the result message received from the each agent simulator as a new delivery message.

The plurality of agent simulators include:
a first agent simulator that performs a simulation of a first agent at a first processing time interval; and
a second agent simulator that performs a simulation of a second agent different from the first agent at a second processing time interval longer than the first processing time interval.

The center controller is further configured to set a number of a second delivery message delivered to the second agent simulator per unit time to be smaller than a number of a first delivery message delivered to the first agent simulator per unit time.

According to the present disclosure, the center controller performs message filtering based on the processing time interval of each agent simulator. More specifically, the center controller sets the number of the delivery message delivered per unit time to the agent simulator whose processing time interval is relatively long to be relatively small. As a result, an amount of messages delivered from the center controller to the agent simulators is reduced as a whole. That is, the unnecessary increase in the traffic is suppressed, and thus the unnecessary consumption of the communication resources is suppressed.

BRIEF DESCRIPTION OF DRAWINGS

FIG. 16 is a block diagram showing a configuration of an agent simulator for an autonomous moving object agent and information flow according to an embodiment of the present disclosure;

EMBODIMENTS

Embodiments of the present disclosure will be described with reference to the accompanying drawings.

1. OUTLINE OF MULTI-AGENT SIMULATION SYSTEM

Figure 1:
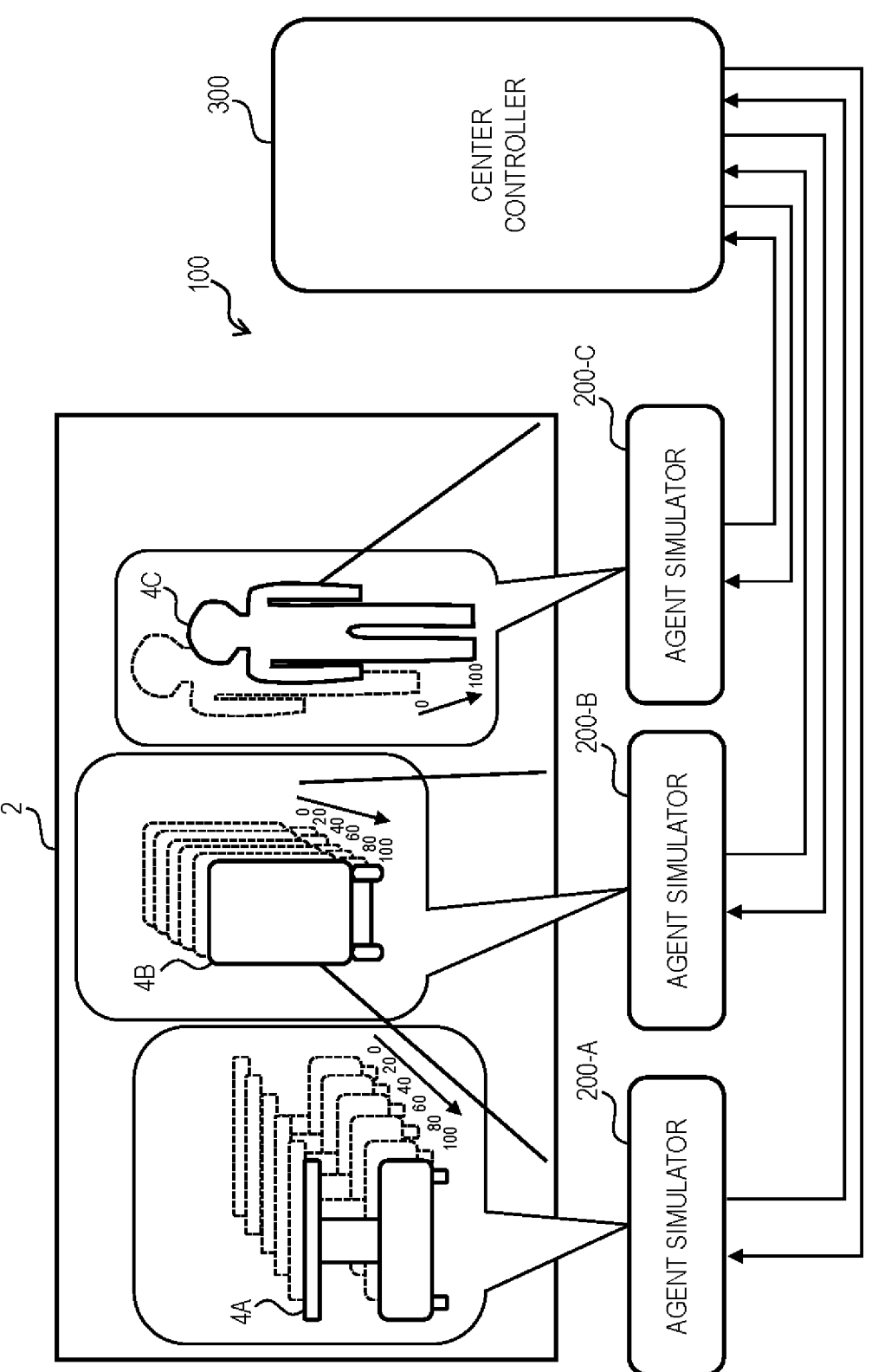
FIG. 1 is a diagram showing an outline of a multi-agent simulation system according to an embodiment of the present disclosure.

An outline of a multi-agent simulation system according to an embodiment of the present disclosure will be described with reference to FIGS. 1 to 3. Hereinafter, a multi-agent simulation system is abbreviated as a MAS system.
1-1. Outline of MAS System FIG. 1 shows a schematic configuration of the MAS system 100 according to the present embodiment. The MAS system 100 performs a simulation of a simulation target world 2 which is a target of simulation by making a plurality of agents 4 interact with each other. The simulation target world 2 is not particularly limited. For example, the simulation target world 2 is a world in which people can coexist with moving objects (e.g., robots, vehicles) and enjoy a variety of services utilizing the moving objects. For example, the simulation target world 2 is a city. Examples of the services provided in the simulation target world 2 include a mobility service such as a on-demand type bus and a regular operation type bus utilizing an autonomous driving vehicle, a logistics service for delivering a package utilizing an autonomous mobile robot.

There are a lot of and various types of agents 4 in the simulation target world 2. The agents 4 constituting the simulation target world 2 include an agent 4 representing a moving object and an agent 4 representing a stationary object. Examples of the moving object represented as the agent 4 include a pedestrian, a robot, a low-speed mobility, a vehicle, a pedestrian controlled by a real person using a VR system, an elevator, and the like. Examples of the stationary object represented as the agent 4 include a sensor including a camera, an automatic door, and the like.

In the example shown in FIG. 1, there are three agents 4A, 4B, and 4C in the simulation target world 2. Among them, the agents 4A and 4B represent robots and the agent 4C represents a pedestrian. It should be noted that the agent 4A and the agent 4B belong to the same category of robot, but there are differences in a size, a shape, a travel speed, an operation, and the like. Therefore, there is a difference between the agent 4A and the agent 4B in visual information that the agent 4C being the pedestrian is able to acquire therefrom.

In the following description, the simulation target world 2 which is a virtual world may be called a virtual world 2, distinguished from a real world.

The MAS system 100 includes a plurality of agent simulators 200. The agent simulator 200 is provided for each agent 4 and performs a simulation of each agent 4. In the example shown in FIG. 1, agent simulators 200-A, 200-B, and 200-C are respectively provided for the agents 4A, 4B, 4C to perform simulations of the agents 4A, 4B, and 4C. Each agent simulator 200 has a difference in configuration according to a type of the subject (target) agent. For example, the agent simulators 200-A and 200-B for the agents 4A and 4B regarding the robots has configurations similar to each other, and the agent simulator 200-C for the agent 4C regarding the pedestrian has a configuration different from those of the agent simulators 200-A and 200-B. The configuration of the agent simulator 200 depending on the type of agent 4 will be described later in detail.

The plurality of agent simulators 200 perform simulations of statuses of the plurality of agents 4 while making the plurality of agents 4 interact with each other through message exchange. A message exchanged between the agent simulators 200 includes information (movement information) on a position and movement of the agent 4 within the virtual world 2. The movement information includes information on a current status and a future plan of a position and movement of the agent. The information on the current status is, for example, a position, a direction, a speed, and acceleration at a current time. The information on the future plans is, for example, a list of positions, directions, speeds, and accelerations at future times. Hereinafter, the message regarding the position and movement of the agent 4 that is exchanged between the agent simulators 200 will be referred to as a "movement message."

Each agent simulator 200 calculates a status of a subject agent which is a subject (target) of the simulation based on a status of a surrounding agent. The surrounding agent is an interacting agent that exists around the subject agent and interacts with the subject agent. Information indicating the status of the surrounding agent is the movement message. Each agent simulator 200 is able to grasp the status of the surrounding agent by exchanging the movement message with another agent simulator 200.

In the example shown in FIG. 1, the agent simulator 200-A grasps the statuses of the agents 4B and 4C based on the movement messages received from the agent simulators 200-B and 200-C, and updates the status of the agent 4A based on the statuses of the agents 4B and 4C. Then, the agent simulator 200-A sends a movement message indicating the updated status of the agent 4A to the agent simulators 200-B and 200-C. Similar processing is performed in the agent-simulators 200-B and 200-C. In this manner, the statuses of the agents 4A, 4B, and 4C are simulated while making the agents 4A, 4B, and 4C interact with each other.

As a method of updating the status of the agent by the agent simulator 200, there are a method of updating at a regular time interval and a method of updating when some event is detected. Even in the latter case, however, an event is forcibly generated such that the status is updated at a some time interval, because not updating for a long time has a large influence on the surrounding agent. The time interval for updating the status of the agent by the agent simulator 200 is referred to as a time granularity.

There are a lot of agents 4 in the virtual world 2 which is the target of the simulation by the MAS system 100. However, their time granularities are not necessary the same. If the time granularities of all agents 4 are the same, it is necessary to set the time granularity of each agent 4 to be in line with an agent with a fastest change rate of status in order to maintain execution performance of the MAS. In that case, however, calculation is performed at a time granularity higher than a necessary time granularity in an agent 4 with a slower change rate of status. Since the interaction between the agents 4 in the MAS is implemented by the exchange of the movement messages, the higher time granularity results in a shorter sending time interval of the movement message accordingly. As a result, the amount of movement messages is increased in the system as a whole and computational resources are consumed wastefully.

In view of the above, in the MAS system 100, the time granularity of the agent 4 may be different depending on the type of the agent 4. For example, a walking speed a pedestrian in the real world is about 1 m/sec. Therefore, when the agent 4 is a pedestrian, the time granularity may be in the order of 1 sec or 100 msec. On the other hand, when the agent 4 is a robot, the time granularity of the order of 100 msec at most, preferably the time granularity of the order of 10 msec is desired. The reason is that a quick and accurate operation is required for the robot as compared with the pedestrian. In the real world, the robot control cannot be realized unless the higher an operation speed required for the robot is, the shorter the time interval for controlling is. The same applies to the simulation. It is not possible to simulate a required operation of the robot unless the time granularity is set according to the operation speed required.

In the example shown in FIG. 1, in the virtual world 2, the time granularity of each of the robotics agents 4A and 4B is set to 20 msec, and the time granularity of the pedestrian agent 4C is set to 100 msec. The agent simulators 200-A,

200-B, and 200-C respectively execute the simulations with control cycles according to the time granularities of the allocated agents 4A, 4B, and 4C. Although the time granularities of the two robotics agents 4A and 4B shown in FIG. 1 are the same, there may be a case where different time granularities are set for the agents of the same type depending on objects of the agents.

In the MAS system 100, the simulation is executed by exchanging the movement messages between the agent simulators 200. However, the exchange of the movement messages for the simulation is not performed directly between the agent simulators 200. The MAS system 100 further includes a center controller 300 that communicates with each agent simulator 200. The movement messages are relayed by the center controller 300 to be exchanged between the agent simulators 200.

In the example shown in FIG. 1, the movement message output from the agent simulator 200-A is received by the center controller 300. Then, the center controller 300 sends the movement message of the agent simulator 200-A to the agent simulators 200-B and 200-C. Similarly, the movement message of the agent simulator 200-B is sent to the agent simulators 200-A and 200-C by the center controller 300, and the movement message of the agent simulator 200-C is sent to the agent simulators 200-A and 200-B by the center controller 300.

1-2. Movement Message Exchange in MAS System

Figure 2:
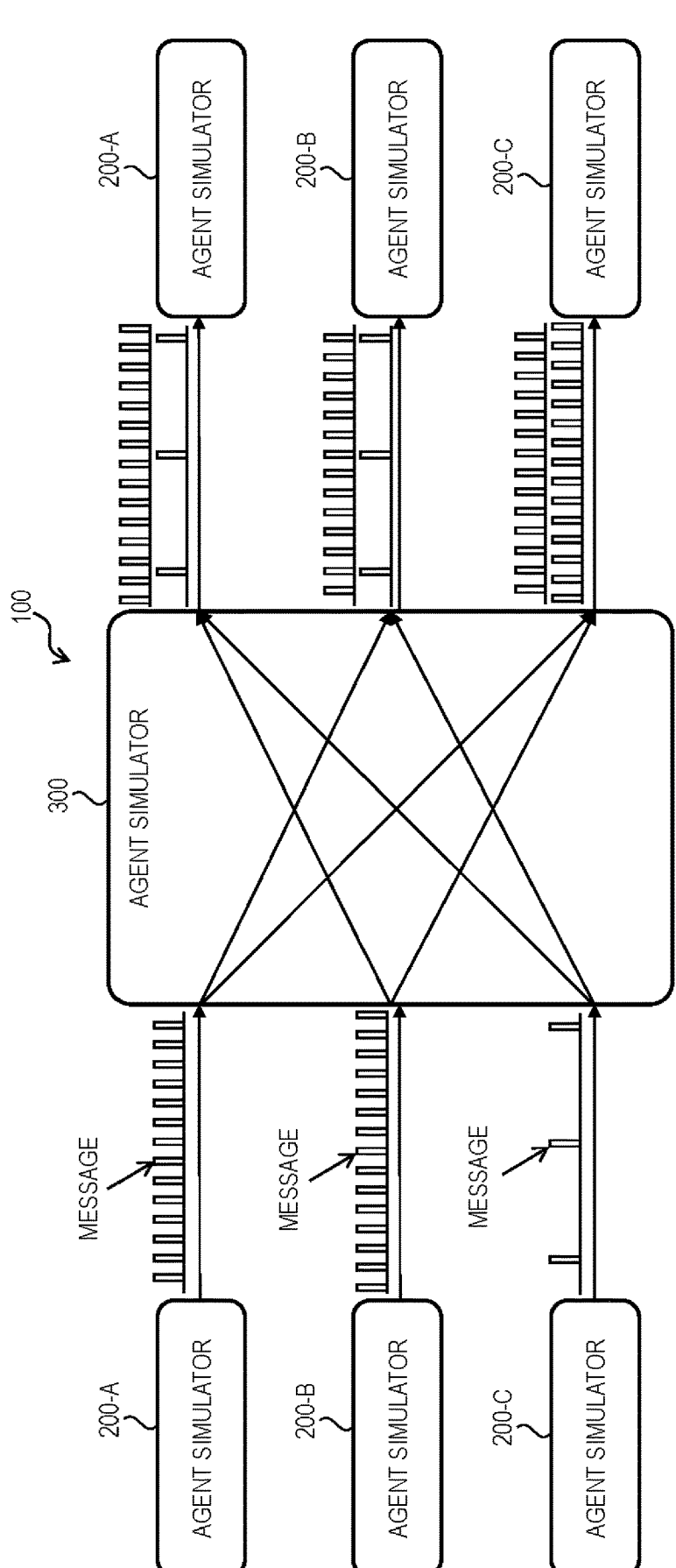
FIG. 2 is a diagram showing an outline of a multi-agent simulation system according to an embodiment of the present disclosure.

FIG. 2 shows an outline of the exchange of the movement messages performed in the MAS system 100. In the MAS system 100, each agent simulator 200 sends the movement message at a time interval corresponding to the time granularity of the agent to be simulated, rather than at a same time interval among the agent simulators 200. When the time granularities of the agents 4A, 4B, and 4C are those as shown in FIG. 1, the agent simulators 200-A and 200-B each sends the movement message at the time interval of 20 msec, and the agent simulator 200-C sends the movement message at the time interval of 100 msec.

The center controller 300 receiving the movement messages from the agent simulators 200-A, 200-B, and 200-C broadcasts the received movement messages at the original time intervals. Thus, the movement message from the agent simulator 200-B is sent to the agent simulator 200-A at a time interval of 20 msec, and the movement message from the agent simulator 200-C is sent to the agent simulator 200-A at a time interval of 100 msec. Similarly, the movement message from the agent simulator 200-A is sent to the agent simulator 200-B at a time interval of 20 msec, and the movement message from the agent simulator 200-C is to the agent simulator 200-B sent at a time interval of 100 msec. Moreover, the movement messages from the agent simulators 200-A and 200-B are sent to the agent simulator 200-C at a time-interval of 20 msec.

As described above, in the MAS system 100, each agent simulator 200 sends the movement message at the sending time interval corresponding to the time granularity of the agent to be simulated, rather than at a same sending time interval among the agent simulators 200. It is thus possible to suppress an increase in the amount of messages exchanged between the agent simulators 200 while maintaining the execution performance of the MAS. Moreover, since the center controller 300 sends the received movement message at the original time interval, it is possible to prevent an old movement message from reaching a destination agent simulator 200 earlier than a new movement message. Furthermore, since the center controller 300 uses broadcasting as a method for sending the movement message, load on the center controller 300 is reduced.

By the way, in the real world, a current status of an entity is determined by a relationship with a current status of another entity interacting with each other. Therefore, in order to simulate a current status of an agent in the virtual world 2, information on a current status of a surrounding agent interacting with each other is desired. However, in the MAS system 100, there is a difference in the sending time interval for sending the movement message between the agent simulators 200 depending on the time granularity of the agent to simulate. Moreover, since the movement messages are sent discretely, an exchange timing of the movement message may be different even among the agent simulators 200 with the same sending time interval. Furthermore, a time delay may occur in a communication of the movement message between the agent simulators 200 through the center controller 300, depending on a processing capacity of a CPU and a network capacity.

In view of the above, in the MAS system 100, when each agent simulator 200 performs the simulation of the current status of the subject agent, the following first to sixth processes are executed.

In the first process, based on a movement message sent from the center controller 300, the agent simulator 200 generates a status of a surrounding agent at a time when the movement message is acquired. In the second process, the agent simulator 200 stores in a memory the status of the surrounding agent generated in the first process.

In the third process, the agent simulator 200 estimates a current status of the surrounding agent based on a past status of the surrounding agent stored in the memory in the second process. When the number of past statuses of the surrounding agent stored in the memory is equal to or more than two, the agent simulator 200 estimates the current status of the surrounding agent by linear extrapolation based on the latest two or more past statuses of the surrounding agent. When the number of past status of the surrounding agent stored in memory is one, the agent simulator 200 estimates that the current status of the surrounding agent is the same as the one past status of the surrounding agent.

In the fourth process, the agent simulator 200 simulates the current status of the subject agent by using the current status of the surrounding agent estimated in the third process. In the fifth process, the agent simulator 200 generates a movement message based on the current status of the subject agent simulated in the fourth process. Then, in the sixth process, the agent simulator 200 sends the movement message generated in the fifth process to the center controller 300.

In the MAS system 100, the processes described above are executed in each agent simulator 200. It is thus possible to simulate the current status of each agent with high accuracy, even when there is a time delay in the communication of the movement message between the agent simulators 200 through the center controller 300. Moreover, it is possible to simulate the current status of each agent with high accuracy, even when there is a difference in the sending timing of the movement message between the agent simulators 200. Furthermore, it is possible to simulate the current status of each agent with high accuracy, even when there is a difference in the sending time interval for sending the movement message between the agent simulators 200 due to a difference in the time granularity between the agents.

1-3. Example of Message Exchange

Figure 3:
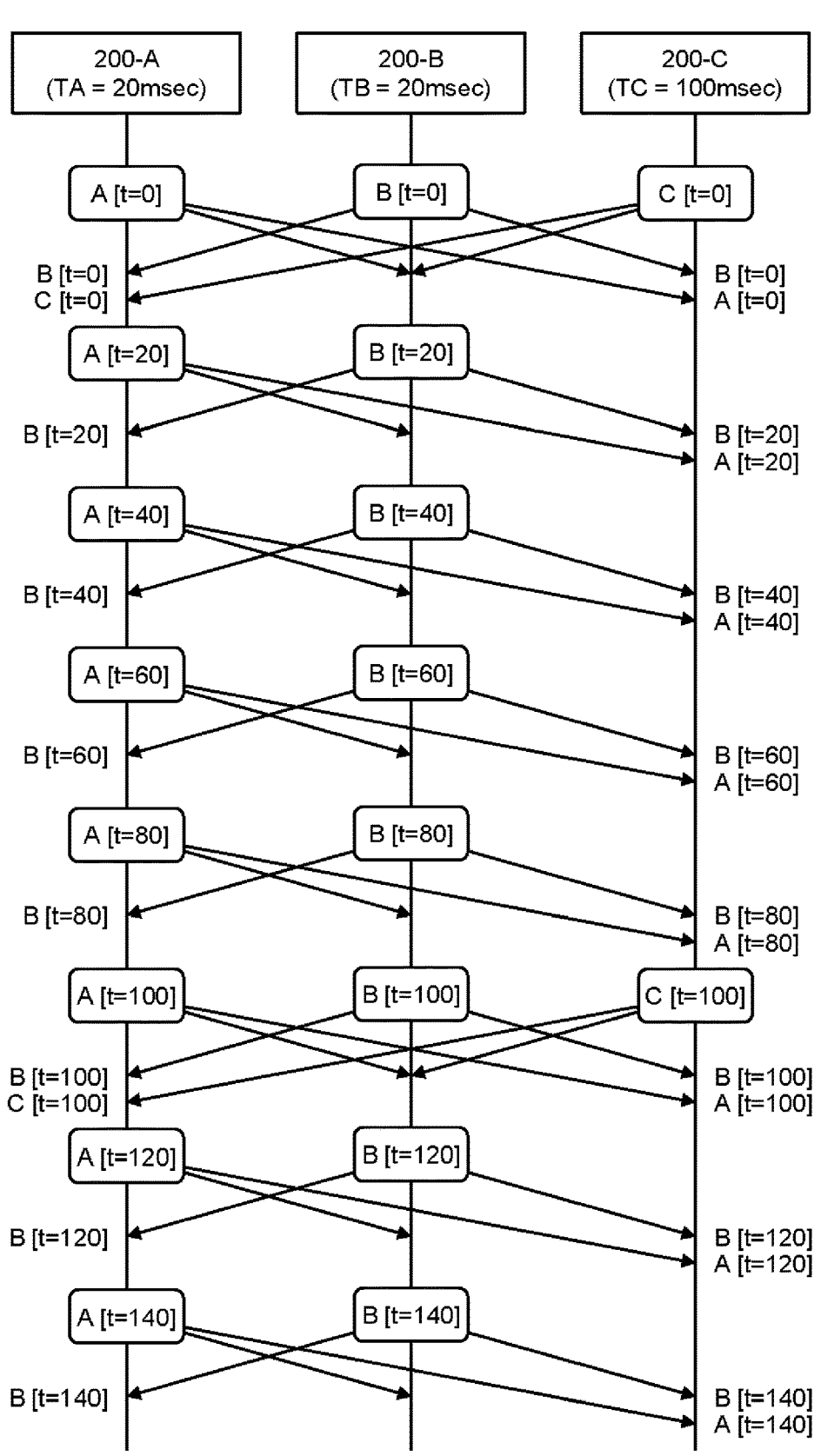
FIG. 3 is a diagram for explaining an example of message exchange in a multi-agent simulation system according to an embodiment of the present disclosure.

FIG. 3 shows an example of the exchange of the movement messages between the agent simulators 200-A, 200-B, and 200-C performed in the MAS-system 100. In order to simplify the explanation, the center controller 300 that relays the communication of the movement message between the agent simulators 200-A, 200-B, and 200-C is omitted. When the time granularities of the agents 4A, 4B, and 4C are those as shown in FIG. 1, the agent simulators 200-A and 200-B each sends the movement message at the time interval of 20 msec, and the agent simulator 200-C sends the movement message at the time interval of 100 msec.

In the present example, a time delay of 12 msec is permitted between the agent simulator 200-A and the agent simulator 200-B. A time delay of 14 msec is permitted between the agent simulator 200-A and the agent simulator 200-C. In addition, a time delay of 10 msec is permitted between the agent simulator 200-B and the agent simulator 200-C.

Each of the agent simulators 200-A, 200-B, and 200-C starts the simulation at a time t=0. However, interval clocks of computers respectively serving as the agent simulators 200-A, 200-B, and 200-C are not necessarily consistent with each other. Therefore, there may be a difference in the simulation start time between the agent simulators 200-A, 200-B, and 200-C. In the MAS system 100, the exchange of the movement messages between the agent simulators 200-A, 200-B, and 200-C is performed on an assumption that there is a difference in the simulation start time.

In the following description, for simplicity, A[t] means a movement message indicating the status of the agent 4A at a time t. B[t] means a movement message indicating the status of the agent 4B at a time t. C[t] means a movement message indicating the status of the agent 4C at a time t. Hereinafter, processing by the agent simulators 200-A, 200-B, and 200-C will be described on a time-series basis.

First, movement messages A[0], B[0], and C[0] indicating initial statuses of the agents 4A, 4B, and 4C are sent from the agent simulators 200-A, 200-B, and 200-C, respectively. Initially, the agent simulators 200-A, 200-B, and 200-C cannot recognize presence of the surrounding agents and thus generate the movement messages A[0], B[0], and C[0], respectively, under an assumption that there is no surrounding agent.

The next sending time by the agent simulator 200-A is a time t=20. Prior to the time t=20, the agent simulator 200-A receives the movement messages B[0] and C[0]. The agent simulator 200-A recognizes the status of the agent 4B at the time t=0 based on the movement message B [0], and estimates that a current status of the agent 4B is the same as the status of the agent 4B at the time t=0. In addition the agent simulator 200-A recognizes the status of the agent 4C at the time t=0 based on the movement message C[0], and estimates that a current status of the agent 4C is the same as the status of the agent 4C at the time t=0. The agent simulator 200-A determines a status of the agent 4A at the time t=20 by the simulation using the statuses of the agents 4B and 4C thus estimated, and sends a movement message A[20].

The next sending time by the agent simulator 200-A is a time t=40. Prior to the time t=40, the agent simulator 200-A receives a new movement message B[20] from the agent simulator 200-B, but receives no new movement message from the agent simulator 200-C. The agent simulator 200-A recognizes the status of the agent 4B at the time t=20 based on the movement message B[20], and estimates a current status of the agent 4B by the linear extrapolation based on the statuses of the agent 4B at the times t=0 and t=20. In addition, the agent simulator 200-A estimates that a current status of the agent 4C is the same as the status of the agent 4C at the time t=0. The agent simulator 200-A determines a status of the agent 4A at the time t=40 by the simulation using the statuses of the agents 4B and 4C thus estimated, and sends a movement message A[40].

The next sending time by the agent simulator 200-A is a time t=60. Prior to the time t=60, the agent simulator 200-A receives a new movement message B[40] from the agent simulator 200-B, but receives no new movement message from the agent simulator 200-C. The agent simulator 200-A estimates a current status of the agent 4B by the linear extrapolation based on the statuses of the agent 4B at the times t=20 and t=40. In addition, the agent simulator 200-A estimates that a current status of the agent 4C is the same as the status of the agent 4C at the time t=0. The agent simulator 200-A determines a status of the agent 4A at the time t=60 by the simulation using the statuses of the agents 4B and 4C thus estimated, and sends a movement message A[60].

The next sending time by the agent simulator 200-A is a time t=80. Prior to the time t=80, the agent simulator 200-A receives a new movement message B[60] from the agent simulator 200-B, but receives no new movement message from the agent simulator 200-C. The agent simulator 200-A estimates a current status of the agent 4B by the linear extrapolation based on the statuses of the agent 4B at the times t=40 and t=60. In addition, the agent simulator 200-A estimates that a current status of the agent 4C is the same as the status of the agent 4C at the time t=0. The agent simulator 200-A determines a status of the agent 4A at the time t=80 by the simulation using the statuses of the agents 4B and 4C thus estimated, and sends a movement message A[80].

The next sending time by the agent simulator 200-A is a time t=100. Prior to the time t=100, the agent simulator 200-A receives a new movement message B[80] from the agent simulator 200-B, but receives no new movement message from the agent simulator 200-C. The agent simulator 200-A estimates a current status of the agent 4B by the linear extrapolation based on the statuses of the agent 4B at the times t=60 and t=80. In addition, the agent simulator 200-A estimates that a current status of the agent 4C is the same as the status of the agent 4C at the time t=0. The agent simulator 200-A determines a status of the agent 4A at the time t=100 by the simulation using the statuses of the agents 4B and 4C thus estimated, and sends a movement message A[100].

The next sending time by the agent simulator 200-A is a time t=120. Prior to the time t=120, the agent simulator 200-A receives a new movement message B[100] from the agent simulator 200-B, and also receives a new movement message C[100] from the agent simulator 200-C. The agent simulator 200-A recognizes the status of the agent 4B at the time t=100 based on the movement message B[100], and estimates a current status of the agent 4B by the linear extrapolation based on the statuses of the agent 4B at the times t=80 and t=100. In addition, the agent simulator 200-A recognizes the status of the agent 4C at the time t=100 based on the movement message C[100], and estimates a current status of the agent 4C by the linear extrapolation based on the statuses of the agent 4C at the times t=0 and t=100. The agent simulator 200-A determines a status of the agent 4A at the time t=120 by the simulation using the statuses of the agents 4B and 4C thus estimated, and sends a movement message A[120].

Processing by the agent simulator 200-B is similar to that in the case of the agent simulator 200-A. The agent simulator 200-B determines the statuses of the agent 4B at the times t=20, 40, 60, 80, 100, 120, and 140. The agent simulator 200-B sends movement messages B[20], B[40], B[60], B[80], B[100], B[120], and B[140] respectively indicating the statuses at the times.

The next sending time by the agent simulator 200-C is the time t=100. Prior to the time t=100, the agent simulator 200-C receives the movement messages A[0], A[20], A[40], A[60], and A[80] from the agent simulator 200-A. The agent simulator 200-C estimates a current status of the agent 4A by the linear extrapolation based on the latest two past statuses, that is, the statuses of the agent 4A at the times time t=60 and t=80. Prior to the time t=100, the agent simulator 200-C receives the movement messages B[0], B[20], B[40], B[60], and B[80] from the agent simulator 200-B as well. The agent simulator 200-C estimates a current status of the agent 4B by the linear extrapolation based on the latest two past statuses, that is, the statuses of the agent 4B at the times t=60 and t=80. The agent simulator 200-C determines a status of the agent 4C at the time t=100 by the simulation using the statuses of the agents 4A and 4B thus estimated. Then, the agent simulator 200-C sends a movement message C[100].

2. MESSAGE FILTERING

The agent 4 allocated for each agent simulator 200-*i* (i=1 to N) is hereinafter referred to as a "subject agent 4*i*." Here, N is a total number of the agent simulators 200 and is an integer of two or more. Each agent simulator 200-*i* performs a simulation of the allocated subject agent 4*i*. As mentioned above, the message is used for the simulation. For convenience sake, the message delivered from the center controller 300 to the agent simulator 200-*i* is hereinafter referred to as a "delivery message MD-i." On the other hand, the message indicating the status of the subject agent 4*i* acquired as a result of the simulation in the agent simulator 200-*i* is hereinafter referred to as a "result message MR-i."

The center controller 300 delivers the delivery message MD-i to the agent simulator 200-*i*. The delivery message MD-i delivered to the agent simulator 200-*i* includes at least one result message MR-j indicating the status of at least one another agent 4*j* (j=1 to N, j≠i) different from the subject agent 4*i*. The agent simulator 200-*i* performs the simulation of the subject agent 4*i* based on the status of the said another agent 4*j* indicated by the delivery message MD-i to determine the status of the subject agent 4*i*. Then, the agent simulator 200-*i* sends the result message MR-i indicating the status of the subject agent 4*i* acquired as a result of the simulation to the center controller 300. The center controller 300 delivers (forwards) the result message MR-i received from the agent simulator 200-*i* as a new delivery message MD.

In the configuration described above, when all messages are delivered from the center controller 300 to each agent simulator 200-*i*, a traffic from the center controller 300 to the agent simulators 200 as a whole is increased. Unnecessary increase in the traffic leads to unnecessary consumption of communication resources. In view of the above, in order to suppress the unnecessary increase in the traffic, the center controller 300 according to the present embodiment performs processing that appropriately filters (selects) the result message MR to be delivered (transferred) as the delivery message MD. Such the processing is hereinafter referred to as "message filtering."

Hereinafter, the message filtering according to the present embodiment will be described. Especially, two types of message filtering, one based on temporal perspective and another based on spatial perspective will be described in detail.

2-1. Message Filtering Based on Temporal Perspective

2-1-1. Outline

First, the message filtering based on the temporal perspective will be described. As noted above, the plurality of agent simulators 200 may include ones having different processing time intervals (time granularities). In this case, it is not always necessary to deliver all the result messages MR as the delivery messages MD to an agent simulator 200 whose processing time interval is relatively long, and thus it is allowed to perform the message filtering.

As an example, the case shown in the above FIG. 3 is considered. The processing time interval TA of the agent simulator 200-A is 20 msec. The processing time interval TB of the agent simulator 200-B is 20 msec. The processing time interval TC of the agent simulator 200-C is 100 msec. That is, the processing time interval TC of the agent-simulator 200-C is relatively long. The agent simulator 200-C receives the movement messages A[0], A[20], A[40], A[60], and A[80] from the agent simulator 200-A and receives the movement messages B[0], B[20], B[40], B[60], and B[80] from the agent simulator 200-B. However, used for the simulation of the subject agent 4C are the movement messages A[60], A[80], B[60], and B[80]. The other movement messages A[0], A[20], A[40], B[0], B[20], and B[40] are not required for the simulation. That is to say, delivering the movement messages A[0], A[20], A[40], B[0], B[20], and B[40] to the agent simulator 200-C whose processing time interval TC is long causes unnecessary increase in the traffic.

Figure 4:
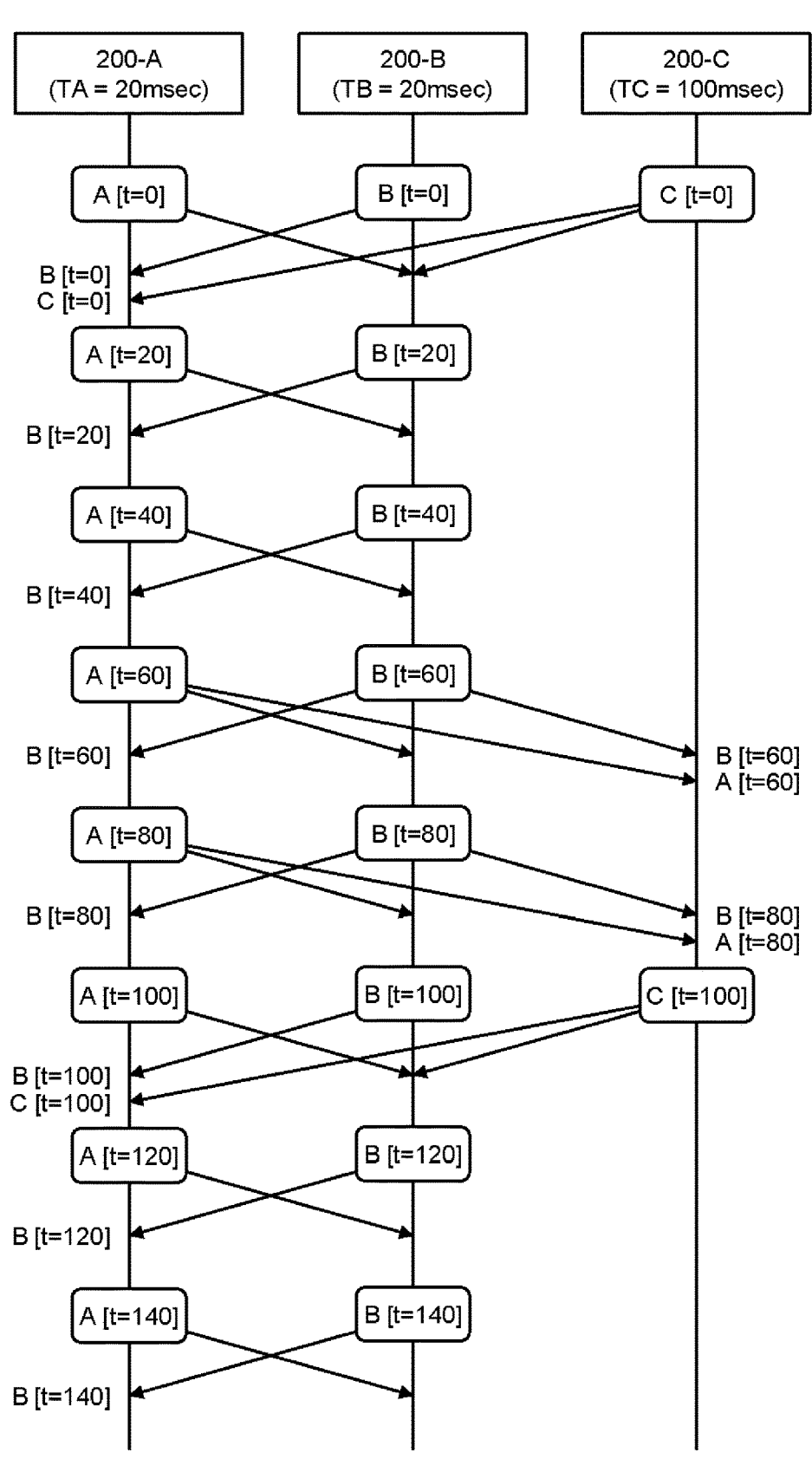
FIG. 4 is a diagram for explaining an example of message filtering based on a temporal perspective according to an embodiment of the present disclosure.

In view of the above, the center controller 300 performs the message filtering as shown in FIG. 4. More specifically, the center controller 300 receives the movement messages A[0], A[20], A[40], A[60], and A[80] from the agent simulator 200-A, and selectively delivers (forwards) the movement messages A[60] and A[80] among them to the agent simulator 200-C without delivering the movement messages A[0], A[20], and A[40] to the agent simulator 200-C. Similarly, the center controller 300 receives the movement messages B[0], B[20], B[40], B[60], and B[80] from the agent simulator 200-B, and selectively delivers (forwards) the movement messages B[60] and B[80] among them to the agent simulator 200-C without delivering the movement messages B[0], B[20], and B[40] to the agent simulator 200-C. As a result, the unnecessary increase in the traffic is suppressed, and thus the unnecessary consumption of the communication resources is suppressed. It should be noted that even when such the message filtering is performed, accuracy of the simulation in the agent simulator 200-C remains the same.

Figure 5:
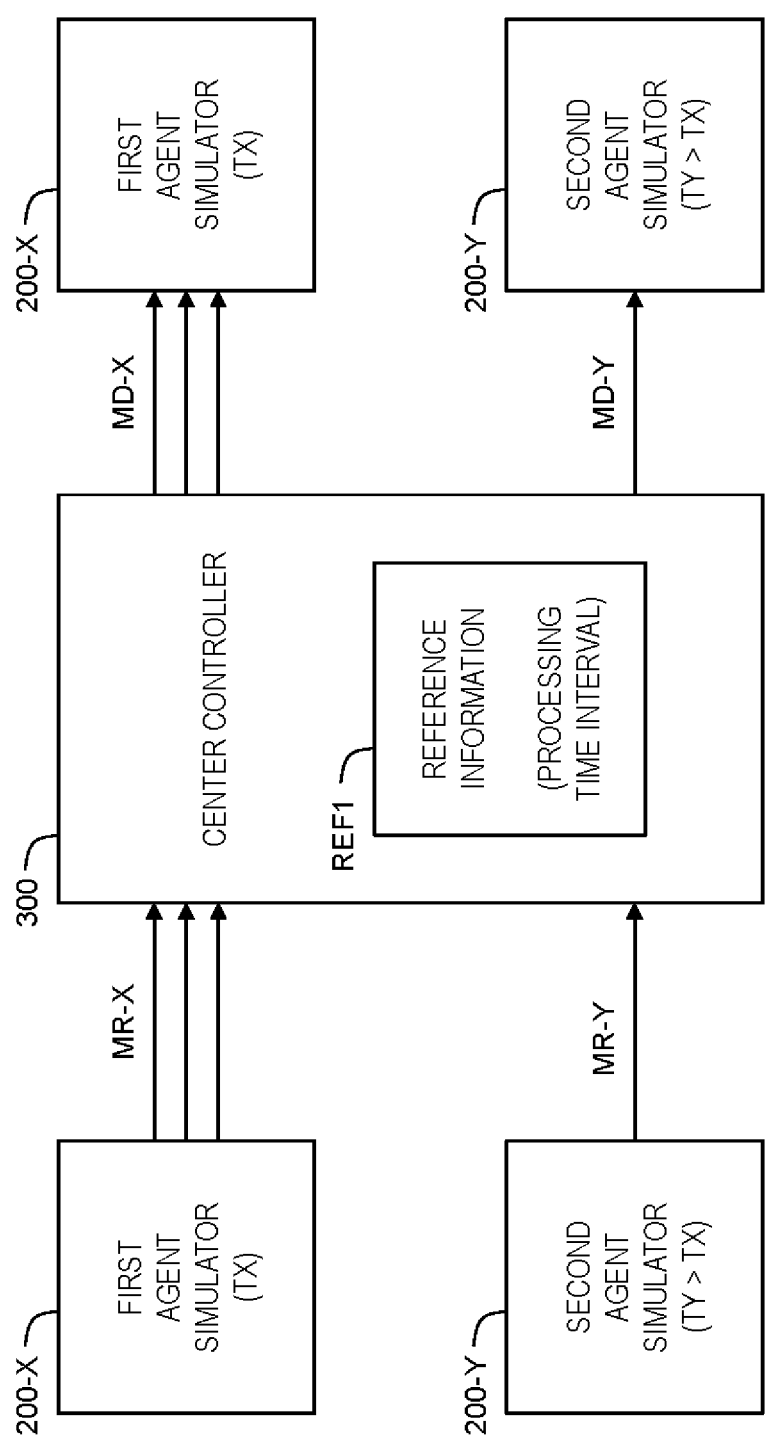
FIG. 5 is a diagram for explaining message filtering based on a temporal perspective according to an embodiment of the present disclosure.

The generalization is as follows. Two agent simulators 200 shown in FIG. 5, that is, a first agent simulator 200-X and a second agent simulator 200-Y are considered. The first agent simulator 200-X performs a simulation of a first agent (subject agent) 4X at a first processing time interval TX. On the other hand, the second agent simulator 200-Y performs a simulation of a second agent (subject agent) 4Y at a second processing time interval TY. The second processing time interval TY is longer than the first processing time interval TX. In this case, the center controller 300 sets a number of a second delivery message MD-Y delivered to the second agent simulator 200-Y per unit time to be smaller than a number of a first delivery message MD-X delivered to the first agent simulator 200-X per unit time. Thus, the unnecessary increase in the traffic is suppressed.

More specifically, the first agent simulator 200-X sends a first result message MR-X regarding the first agent 4X to the center controller 300 at a first frequency corresponding to the first processing time interval TX. The center controller 300 receives the first result message MR-X at the first frequency corresponding to the first processing time interval TX. However, it is not necessary to deliver the first result message MR-X at the same first frequency to the second agent simulator 200-Y whose processing time interval is long. For the second agent simulator 200-Y, it is enough to deliver the first result message MR-X at a second frequency corresponding to the second processing time interval TY. The second frequency corresponding to the second processing time interval TY is lower than the first frequency corresponding to the first processing time interval TX. The center controller 300 selects only a part of the first result messages MR-X received from the first agent simulator 200-X as the second delivery message MD-Y, and delivers the selected second delivery message MD-Y to the second agent simulator 200-Y. In other words, the center controller 300 delivers the second delivery message MD-Y to the second agent simulator 200-Y at the second frequency lower than the first frequency.

The second agent simulator 200-Y determines the status of the second agent 4Y at the second processing time interval TY. The center controller 300 selects a part of the first result messages MR-X received from the first agent simulator 200-X as the second delivery message MD-Y. Here, as an example, the center controller 300 preferably selects the second delivery message MD-Y so as to include at least a latest first result message MR-X received before the timing at which the second agent simulator 200-Y determines the status of the second agent 4Y (see FIG. 4). In the example shown in FIG. 4, the latest two first result messages MR-X (e.g., A[60] and A[80]) are selected as the second delivery messages MD-Y. Selecting the second delivery message MD-Y so as to include at least the latest first result message MR-X makes it possible to increase accuracy of the simulation regarding the second agent 4Y in the second agent simulator 200-Y.

The second agent simulator 200-Y sends a second result message MR-Y regarding the second agent 4Y to the center controller 300 at the second frequency corresponding to the second processing time interval TY. The center controller 300 receives the second result message MR-Y at the second frequency corresponding to the second processing time interval TY. The center controller 300 may deliver all the second result messages MR-Y as first delivery messages MD-X to the first agent simulator 200-X.

The center controller 300 retains "reference information REF1" indicating the processing time interval in each agent simulator 200-*i*. For example, the processing time interval in each agent simulator 200-*i* is preset and the reference information REF1 is provided in advance to the center controller 300. Based on the reference information REF1, the center controller 300 grasps the processing time interval in each agent simulator 200-*i* and adjusts the delivery message MD to be delivered to each agent simulator 200-*i*. In other words, the center controller 300 filters the delivery message MD to be delivered to each agent simulator 200-*i* according to the processing time interval in each agent simulator 200-*i*.

2-1-2. Configuration Example

Figure 6:
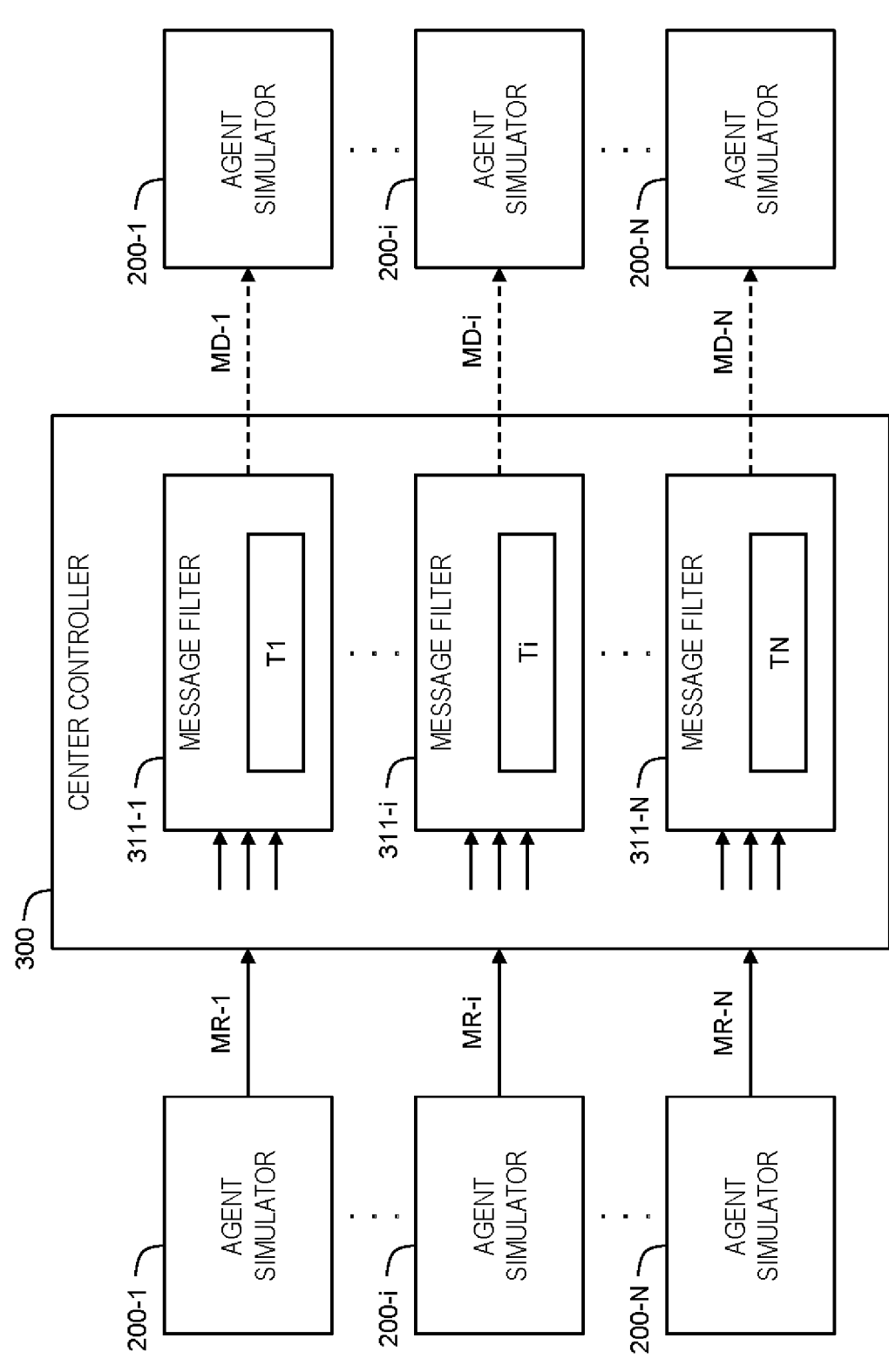
FIG. 6 is a block diagram showing a configuration example related to message filtering based on a temporal perspective according to an embodiment of the present disclosure.

FIG. 6 is a block diagram showing a configuration example related to the message filtering based on the temporal perspective. In the example shown in FIG. 6, the center controller 300 includes a plurality of message filters 311-1 to 311-N. The plurality of message filters 311-1 to 311-N are respectively provided for a plurality of agent simulators 200-1 to 200-N and respectively perform the message filtering with respect to the plurality of agent simulators 200-1 to 200-N. That is, the plurality of message filters 311-1 to 311-N adjust the numbers of delivery messages MD-1 to MD-N to be delivered to the plurality of agent simulators 200-1 to 200-N, respectively.

More specifically, the plurality of message filters 311-1 to 311-N retain information (the reference information REF1) regarding the processing time intervals Ti to TN of the plurality of agent simulators 200-1 to 200-N, respectively. The message filter 311-i adjusts a number of the delivery message MD-i to be delivered to the agent simulator 200-i based on the information of the processing time interval Ti. In the example shown in FIG. 5, the first message filter 311-X adjusts the number of the first delivery message MD-X to be delivered to the first agent simulator 200-X based on the information of the first processing time interval TX. The second message filter 311-Y adjusts the number of the second delivery message MD-Y to be delivered to the second agent simulator 200-Y based on the information of the second processing time interval TY. Each message filter 311-i includes a message queue for adjusting the number of the delivery message MD-i.

Figure 7:
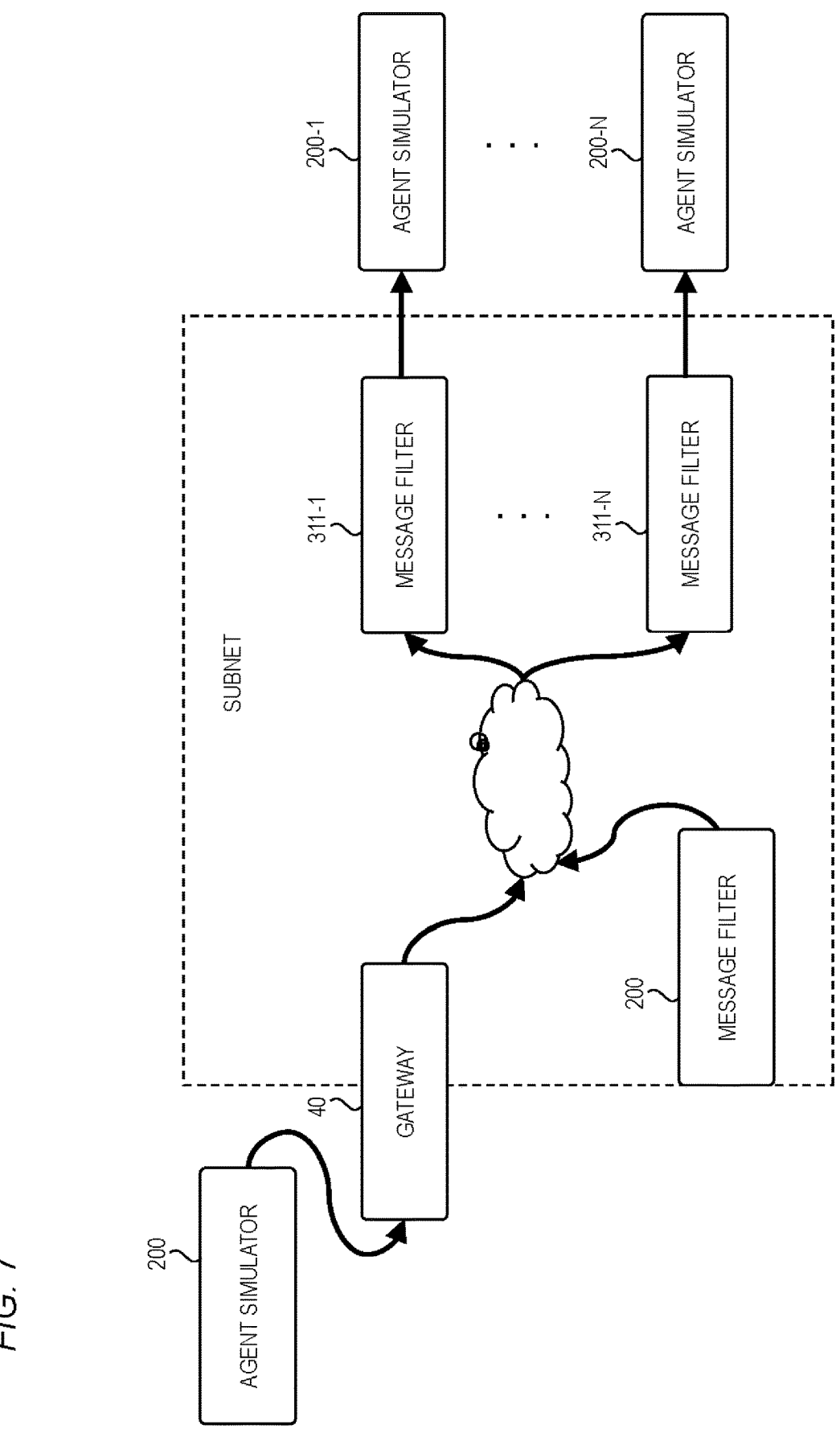
FIG. 7 is a block diagram showing a configuration example related to message filtering based on a temporal perspective according to an embodiment of the present disclosure.

FIG. 7 shows an example of an arrangement of the agent simulators 200 and the message filters 311. The plurality of message filters 311-1 to 311-N are located in a same subnet. An agent simulator 200 may be present in the same subnet. The agent simulator 200 present in the same subnet broadcasts the result message MR to the plurality of message filters 311-1 to 311-N. An agent simulator 200 that is present outside the same subnet is connected to the subnet through a gateway 40. The gateway 40 receives the result message MR from the agent simulator 200 and broadcasts the received result message MR to the plurality of message filters 311-1 to 311-N. Utilizing broadcasting makes it possible to efficiently distribute the result message MR to each message filter 311-i.

2-1-3. Effect

As described above, in one embodiment, the center controller 300 performs the message filtering based on the processing time interval Ti of each agent simulator 200-i. More specifically, the center controller 300 sets the number of the delivery message MD delivered per unit time to the agent simulator 200 whose processing time interval is relatively long to be relatively small. As a result, an amount of messages delivered from the center controller 300 to the agent simulators 200 is reduced as a whole. That is, the unnecessary increase in the traffic is suppressed, and thus the unnecessary consumption of the communication resources is suppressed.

2-2. Message Filtering Based on Spatial Perspective

2-2-1. Outline

Next, the message filtering based on the spatial perspective will be described. There are various distances between the agents 4 in the simulation target world 2. It is not always necessary to exchange all messages between agents 4 distant from each other, and thus it is allowed to perform the message filtering.

Here, a distance between agents 4 being short means that a degree of interaction between the agents 4 is high, and a distance between agents 4 being long means that a degree of interaction between the agents 4 is low. It can be said that the distance between the agents 4 is an inverse of a degree of interaction between the agents 4. For example, when two agents 4 are in a line-of-sight (LOS) environment, a "straight-line distance (Euclidean distance)" or a "Manhattan distance" between the two agents 4 is used.

The distance when two agents 4 are in a non-line-of-sight environment is as follows. For example, in a case of a simulation on the premise that an agent 4 watches another agent 4, the distance between the two agents 4 can be regarded as infinite because the two agents 4 cannot see each other. As another example, in a case of a simulation on the premise that an agent 4 hears a sound made by another agent 4, a propagation of the sound is simulated by ray tracing, and a length of the shortest ray (i.e., a shortest propagation path length) is used as the distance.

The result message MR-i sent from each agent simulator 200-i to the center controller 300 includes the latest position information of each agent 4i in the simulation target world 2. The center controller 300 retains spatial configuration information of the simulation target world 2. Based on the spatial configuration information and the position information of each agent 4i, the center controller 300 is able to calculate the distance between the agents 4 in the simulation target world 2.

Figure 8:
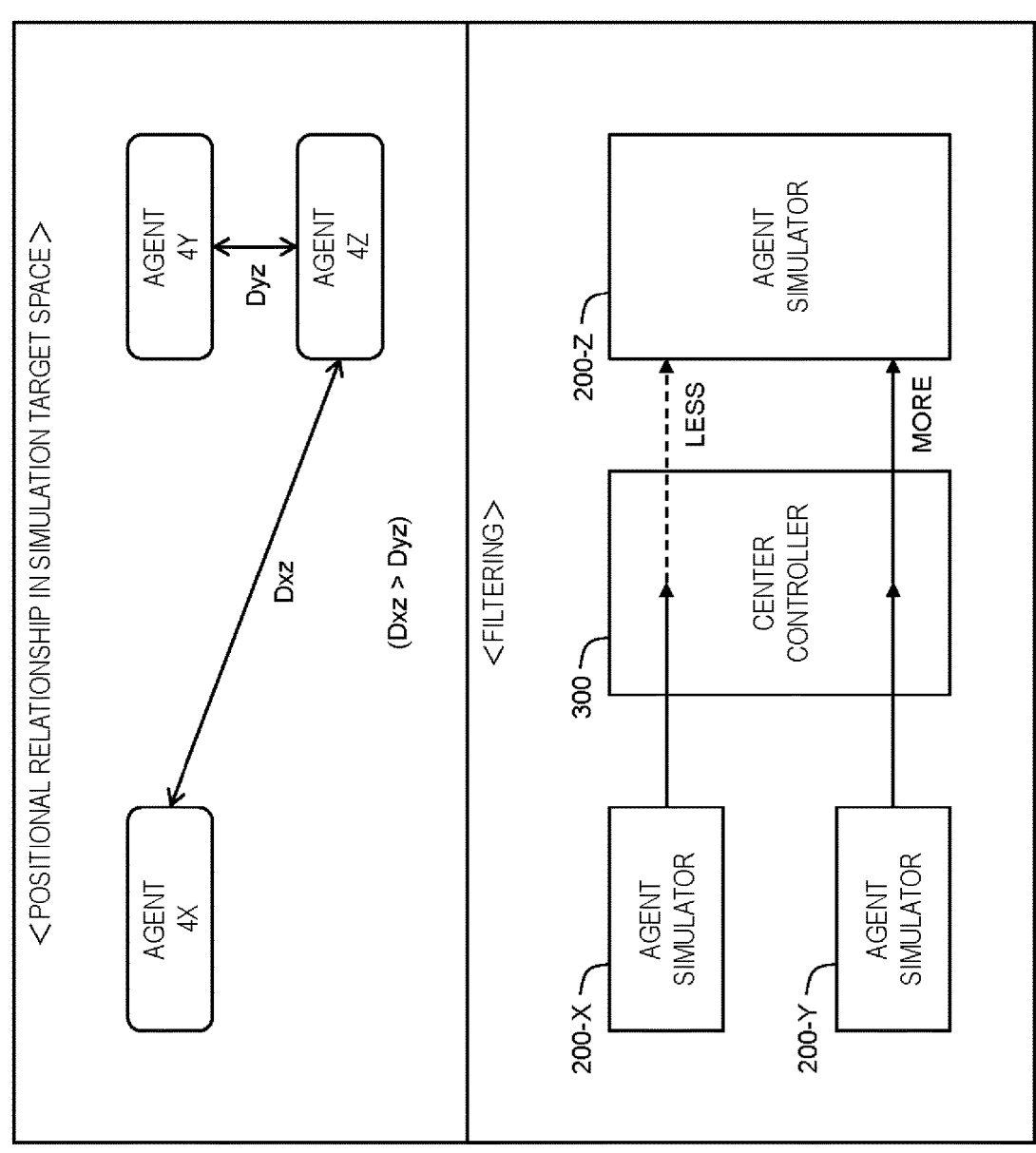
FIG. 8 is a conceptual diagram for explaining an outline of message filtering based on a spatial perspective according to an embodiment of the present disclosure.
Figure 9:
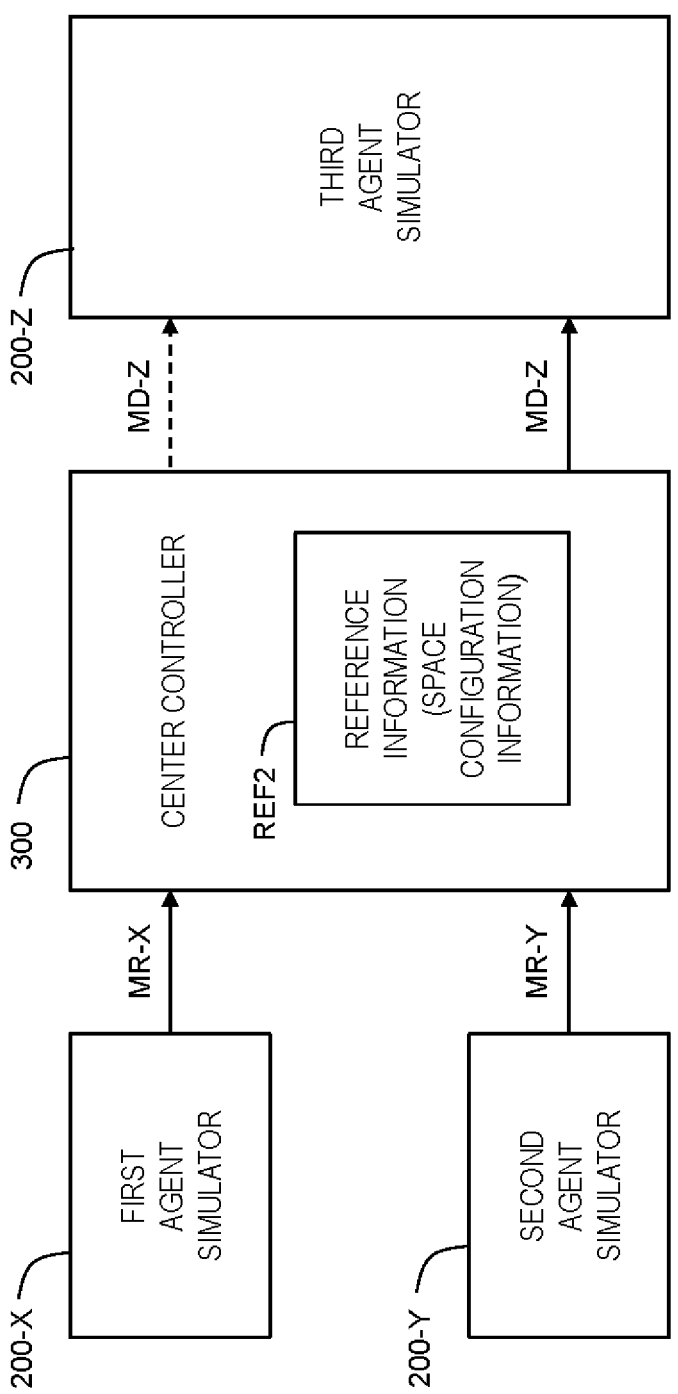
FIG. 9 is a block diagram for explaining an outline of message filtering based on a spatial perspective according to an embodiment of the present disclosure.

FIGS. 8 and 9 are conceptual diagrams for explaining an outline of the message filtering based on the spatial perspective. Here, three agents 4X, 4Y, and 4Z and three agent simulators 200-X, 200-Y, and 200-Z are considered. In the simulation target world 2, a distance Dxz between the first agent 4X and the third agent 4Z is greater than a distance Dyz between the second agent 4Y and the third agent 4Z.

The first agent simulator 200-X performs a simulation of the first agent (subject agent) 4X. The second agent simulator 200-Y performs a simulation of the second agent (subject agent) 4Y. The third agent simulator 200-Z performs a simulation of the third agent (subject agent) 4Z. The first agent simulator 200-X sends first result messages MR-X regarding the first agent 4X to the center controller 300. The second agent simulator 200-Y sends second result messages MR-Y regarding the second agent 4Y to the center controller 300. The center controller 300 receives the first result messages MR-X from the first agent simulator 200-X and delivers at least a part of the first result messages MR-X as a third delivery message MD-Z to the third agent simulator 200-Z. Also, the center controller 300 receives the second result messages MR-Y from the second agent simulator 200-Y and delivers at least a part of the second result messages MR-Y as the third delivery message MD-Z to the third agent simulator 200-Z.

In the example shown in FIGS. 8 and 9, the distance Dxz between the first agent 4X and the third agent 4Z is greater than the distance Dyz between the second agent 4Y and the third agent 4Z. In this case, the center controller 300 sets a delivery frequency of delivering the first result message MR-X to the third agent simulator 200-Z to be lower than a delivery frequency of delivering the second result message MR-Y to the third agent simulator 200-Z. As a result, the unnecessary increase in the traffic is suppressed, and thus the unnecessary consumption of the communication resources is suppressed. It should be noted that even when the delivery frequency of the first result message MR-X regarding the distant first agent 4X becomes low, accuracy of the simulation in the third agent simulator 200-Z is not reduced so much.

As shown in FIG. 9, the center controller 300 retains reference information REF2. The reference information REF2 includes the spatial configuration information of the simulation target world 2. The center controller 300 is able to grasp the distance between the agents 4 based on the spatial configuration information and the position information of each agent 4i included in the result message MR. Further, the reference information REF2 includes functional information that indicates a correspondence relationship between the distance between the agents 4 and the delivery frequency. The function information is generated in advance according to the user's policy. Based on the function information, the center controller 300 sets the delivery frequency according to the distance between the agents 4.

2-2-2. Partitioning

Figure 10:
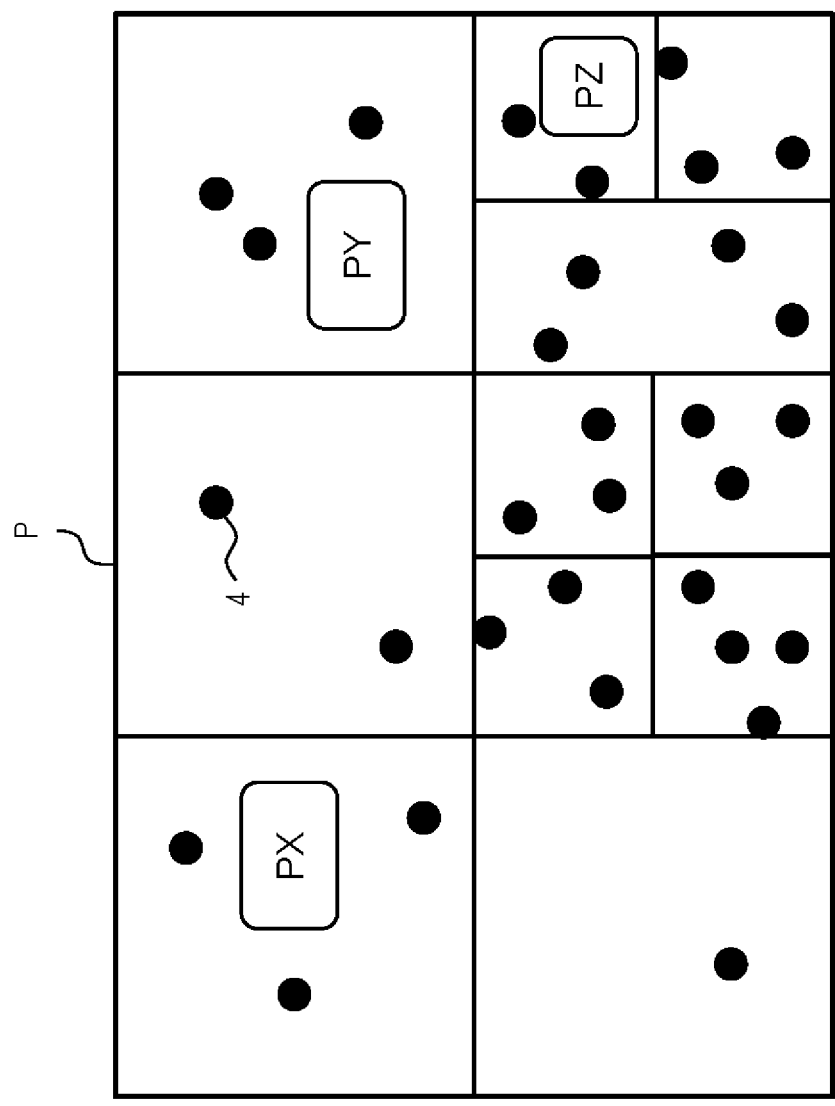
FIG. 10 is a diagram for explaining an outline of message filtering based on a spatial perspective according to an embodiment of the present disclosure.

As shown in FIG. 10, a space of the simulation target world 2 may be divided into a plurality of partitions P (voxels). The partition configuration may be fixed or may vary dynamically. For example, the partition configuration may be dynamically set according to a spatial density of the agents 4. In that case, as shown in FIG. 10, an area where the density of the agents 4 is higher is divided into more partitions P, and a size of each partition P becomes smaller. The partition configuration is determined by a well-known space partitioning algorithm.

The center controller 300 may perform the message filtering in units of partition P according to a distance between the partitions P. The distance between two partitions P is, for example, a distance between respective centers of gravity of the two partitions P. As another example, the distance between two partitions P is a maximum value of distances between two points respectively belonging to the two partitions P. As yet another example, the distance between two partitions P is a minimum value of distances between two points respectively belonging to the two partitions P.

The center controller 300 determines the partition configuration by a well-known space partitioning algorithm. Information of the partition configuration also is added to the reference information REF2 described above, in addition to the spatial configuration information of the simulation target world 2. The center controller 300 calculates the distance between the partitions P based on the reference information REF2. Further, the reference information REF2 includes function information that indicates a correspondence relationship between the distance between the partitions P and the delivery frequency. The function information is generated in advance according to the user's policy. Based on the function information, the center controller 300 sets the delivery frequency according to the distance between the partitions P.

As an example, three partitions PX, PY, and PZ shown in FIG. 10 are considered. In the simulation target world 2, a distance between the first partition PX and the third partition PZ is greater than a distance between the second partition PY and the third partition PZ.

The center controller 300 receives first result messages MR-X from each agent simulator 200 that performs the simulation of each agent 4 belonging to the first partition PX. Also, the center controller 300 receives second result messages MR-Y from each agent simulator 200 that performs the simulation of each agent 4 belonging to the second partition PY. The center controller 300 selects at least a part of the first result messages MR-X and the second result messages MR-Y as a third delivery message MD-Z for the third partition PZ. Then, the center controller 300 delivers the third delivery message MD-Z to each agent simulator 200 that performs the simulation of each agent 4 belonging to the third partition PZ. In the example shown in FIG. 10, the distance between the first partition PX and the third partition PZ is greater than the distance between the second partition PY and the third partition PZ. In this case, the center controller 300 sets a delivery frequency of delivering the first result message MR-X as the third delivery message MD-Z to be lower than a delivery frequency of delivering the second result message MR-Y as the third delivery message MD-Z.

Figure 11:
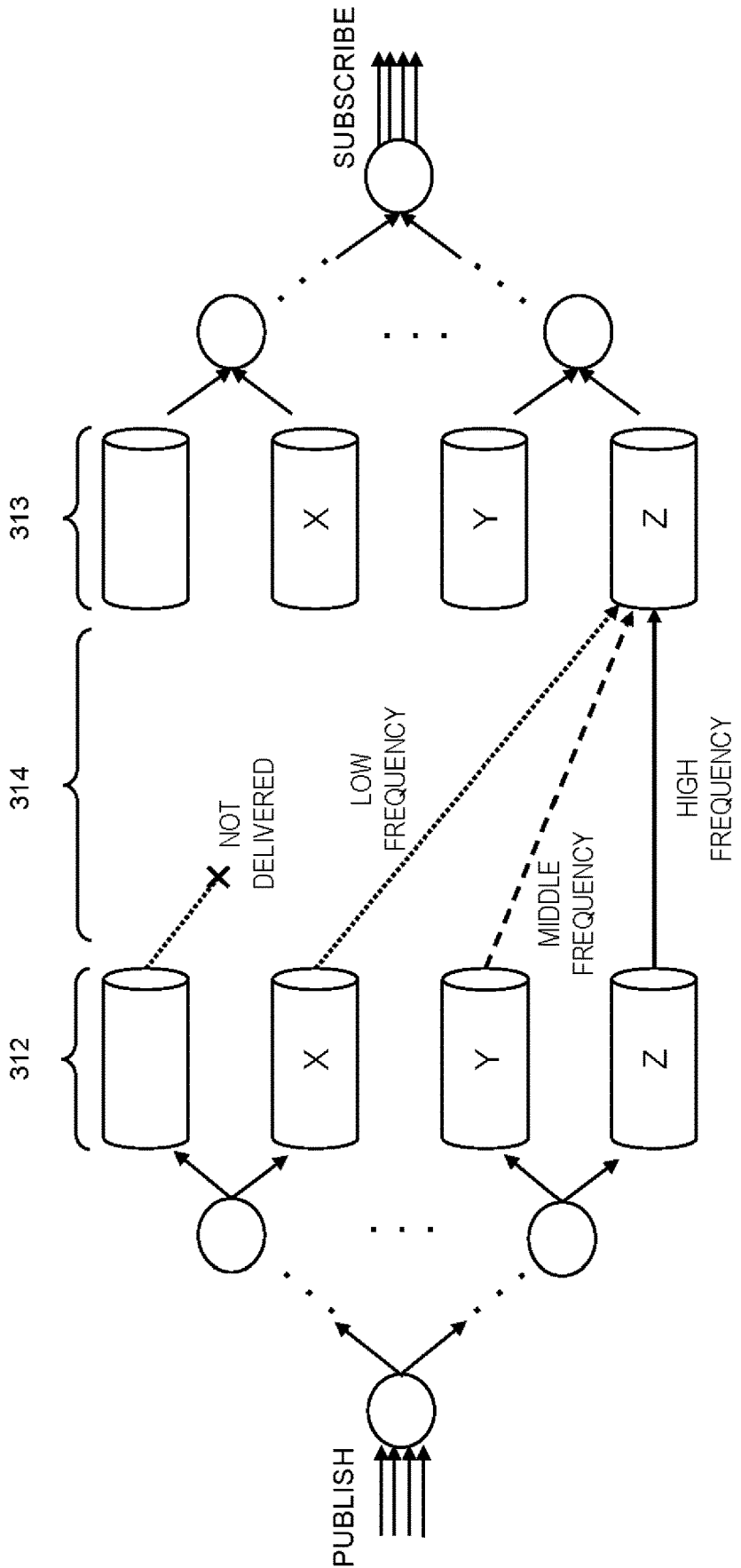
FIG. 11 is a block diagram showing a first configuration example related to message filtering based on a spatial perspective according to an embodiment of the present disclosure.

For example, as shown in FIG. 11, the center controller 300 includes a first partition receive queue 312-X, a second partition receive queue 312-Y, and a third partition send queue 313-Z. The first partition receive queue 312-X stores the first result message MR-X received from each agent simulator 200 that performs the simulation of each agent 4 belonging to the first partition PX. The second partition receive queue 312-Y stores the second result message MR-Y received from each agent simulator 200 that performs the simulation of each agent 4 belonging to the second partition PY. The third partition send queue 313-Z stores the third delivery message MD-Z to be delivered to each agent simulator 200 that performs the simulation of each agent 4 belonging to the third partition PZ. The center controller 300 forwards necessary ones among the first result messages MR-X stored in the first partition receive queue 312-X to the third partition send queue 313-Z. Moreover, the center controller 300 forwards necessary ones among the second result messages MR-Y stored in the second partition receive queue 312-Y to the third partition send queue 313-Z. In the example shown in FIG. 10, the distance between the first partition PX and the third partition PZ is greater than the distance between the second partition PY and the third partition PZ. In this case, the center controller 300 sets a frequency of forwarding the first result message MR-X from the first partition receive queue 312-X to the third partition send queue 313-Z to be lower than a frequency of forwarding the second result message MR-Y from the second partition receive queue 312-Y to the third partition send queue 313-Z.

As described above, in the case where the space of the simulation target world 2 is divided into the plurality of partitions P, the message filtering is performed in units of the partition P. This also enables the suppression of the unnecessary increase in the traffic is suppressed and thus the suppression of the unnecessary consumption of the communication resources.

Furthermore, performing the message filtering in units of the partition P makes it possible to reduce computation load. For example, let us consider a case a total number of agents 4 is 1000 and a total number of partitions P is 10. In the case where the message filtering is performed in units of the agent 4, approximately $10^6$ computation processes are required for calculating the distances for all the pairs of the agents 4. On the other hand, in the case where the message filtering is performed in units of the partition P, the number of computation processes required for calculating the distances for all the pairs of the partitions P is 90. Such the reduction in the computation load is preferable in terms of a simulation speed and a simulation cost.

2-2-3. Configuration Example

FIG. 11 is a block diagram showing a first configuration example related to the message filtering based on the spatial perspective. In the first configuration example, the center controller 300 is designed to perform the message filtering based on a "Publish/Subscribe model." More specifically, the center controller 300 includes a plurality of receive queues 312, a plurality of send queues 313, and a forwarder 314.

The plurality of receive queues 312 are provided for the plurality of partitions P, respectively. Similarly, the plurality of send queues 313 are provided for the plurality of partitions P, respectively. That is, the receive queue 312 and the send queue 313 are provided for each partition P. Each receive queue 312 stores the result message MR received from the agent simulator 200 that performs the simulation of each agent 4 belonging to the corresponding partition P. Each send queue 313 stores the delivery message MD to be delivered to the agent simulator 200 that performs the simulation of each agent 4 belonging to the corresponding partition P.

Each agent simulator 200-$i$ sends the result message MR-i regarding the agent 4$i$ to the center controller 300 (i.e., Publish). The message MR-i includes the position information of the agent 4$i$ in the simulation target world 2. Based on the position information of the agent 4$i$ and the partition configuration, the center controller 300 recognizes a partition P to which the agent 4$i$ belongs by using a decision tree or the like. That is, the center controller 300 sorts the result message MR-i into the receive queue 312 corresponding to the partition P to which the agent 4$i$ belongs by using a decision tree or the like.

Moreover, each agent simulator 200-$i$ acquires the delivery message MD-i regarding the agent 4$i$ from the center controller 300 (i.e., Subscribe). For example, based on the position information of the agent 4$i$ and the partition configuration, each agent simulator 200-$i$ recognizes the partition P to which the agent 4$i$ belongs by using a decision tree or the like. That is, each agent simulator 200-$i$ recognizes the send queue 313 in which the delivery message MD-i regarding the agent 4$i$ is stored by using a decision tree or the like. Then, each agent simulator 200-$i$ acquires (pulls) the delivery message MD-i regarding the agent 4$i$ from the send queue 313. It should be noted that the Subscribe is not limited to the Pull scheme. As another example, the Subscribe may be implemented by Push scheme.

The forwarder 314 forwards necessary ones among the result messages MR stored in each receive queue 312 to necessary send queues 313. The function of the forwarder 314 is set from the perspective of the message filtering described above. That is, the forwarder 314 sets the frequency of forwarding the result message MR according to the distance between the partitions P for each combination of the receive queue 312 and the send queue 313. As described above, the reference information REF2 includes the information on the partition configuration and the function information indicating the correspondence relationship between the distance between the partitions P and the delivery frequency. The center controller 300 is able to set the function of the forwarder 314 based on the reference information REF2.

In the example shown in FIG. 10 described above, the distance between the first partition PX and the third partition PZ is greater than the distance between the second partition PY and the third partition PZ. In this case, the center controller 300 sets the frequency of forwarding the first result message MR-X from the first partition receive queue 312-X to the third partition send queue 313-Z to be lower than the frequency of forwarding the second result message MR-Y from the second partition receive queue 312-Y to the third partition send queue 313-Z. It should be noted that a frequency of forwarding from a third partition receive queue 312-Z to the third partition send queue 313-Z is the highest.

Figure 12:
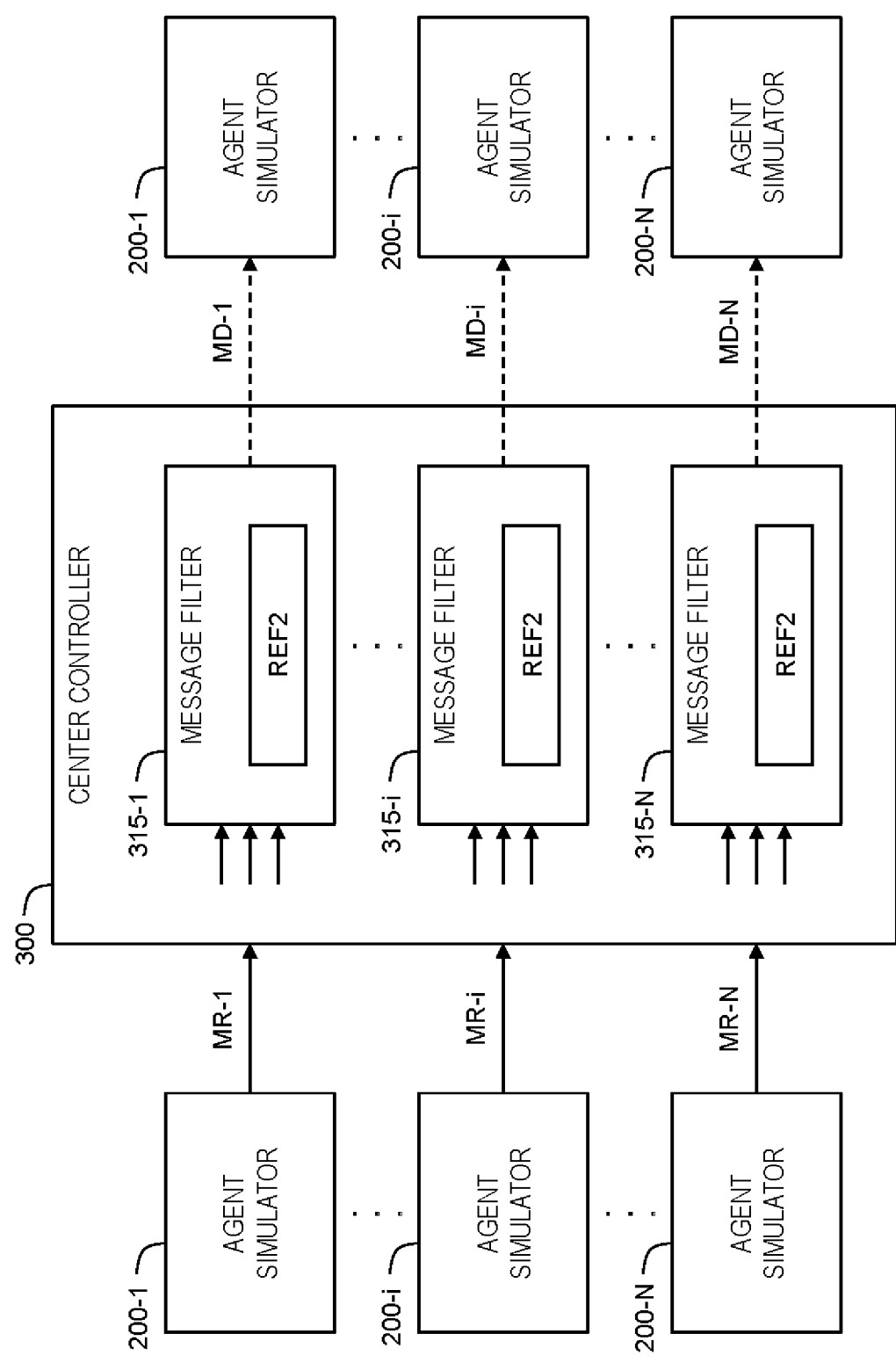
FIG. 12 is a block diagram showing a second configuration example related to message filtering based on a spatial perspective according to an embodiment of the present disclosure.

FIG. 12 is a block diagram showing a second configuration example related to the message filtering based on the spatial perspective. In the second configuration example, the center controller 300 includes a plurality of message filter 315-1 to 315-N. The plurality of message filters 315-1 to 315-N are respectively provided for the plurality of agent simulators 200-1 to 200-N and respectively perform the message filtering with respect to the plurality of agent simulators 200-1 to 200-N. That is, the plurality of message filters 315-1 to 315-N adjust the numbers of delivery messages MD-1 to MD-N to be delivered to the plurality of agent simulators 200-1 to 200-N, respectively.

More specifically, each message filter 315-$i$ receives the result messages MR-1 to MR-N respectively from the plurality of agent simulators 200-1 to 200-N. Each result message MR includes the position information of each agent 4. Moreover, each message filter 315-$i$ retains the reference information REF2 (i.e., the spatial configuration information and the function information). Each message filter 315-$i$ calculates a distance between the subject agent 4$i$ and another agent 4 based on the reference information REF2 (the spatial configuration information) and the position information included in the result message MR. Furthermore, based on the reference information REF2 (the function information), each message filter 315-$i$ sets the delivery frequency according to the distance for each of the result messages MR-1 to MR-N. Then, each message filter 315-$i$ delivers the result messages MR-1 to MR-N as the delivery message MD-i to the agent simulator 200-$i$ according to the set delivery frequency. Each message filter 315-$i$ includes a message queue for adjusting the number of delivery messages MD-i.

An example of the arrangement of the agent simulators 200 and the message filters 315 is as shown in FIG. 7 described above.

2-2-4. Effect

As described above, in one embodiment, the center controller 300 performs the message filtering based on the distance between the agents 4. More specifically, the center controller 300 sets the delivery frequency of the delivery message MD to be low between the agent simulators 200 performing the simulations of the agents 4 distant from each other. As a result, an amount of messages delivered from the center controller 300 to the agent simulators 200 is reduced as a whole. That is, the unnecessary increase in the traffic is suppressed, and thus the unnecessary consumption of the communication resources is suppressed.

The space of the simulation target world 2 may be divided into the plurality of partitions P (see FIG. 10). In this case, the message filtering is performed in units of the partition P (see FIG. 11). Even in this case, the unnecessary increase in the traffic is suppressed, and thus the unnecessary consumption of the communication resources is suppressed. Furthermore, performing the message filtering in units of the partition P makes it possible to reduce the computation load. Such the reduction in the computation load is preferable in terms of the simulation speed and the simulation cost.

2-3. Mode Switching

The center controller 300 may be configured to be able to turn ON/OFF the message filtering. In that case, operation modes of the center controller 300 include a "first mode" that does not perform the message filtering and a "second mode" that performs the message filtering. In the first mode, the center controller 300 delivers the result message MR received from each agent simulator 200 as a new delivery message MD without filtering. In the second mode, on the other hand, the center controller 300 selectively delivers the result message MR received from each agent simulator 200 as a new delivery message MD.

The center controller 300 switches the operation mode between the first mode and the second mode depending on a situation. For example, the center controller 300 performs the mode switching from a standpoint of a balance between "suppression of the traffic" and "suppression of the processing load in the center controller 300."

Figure 13:
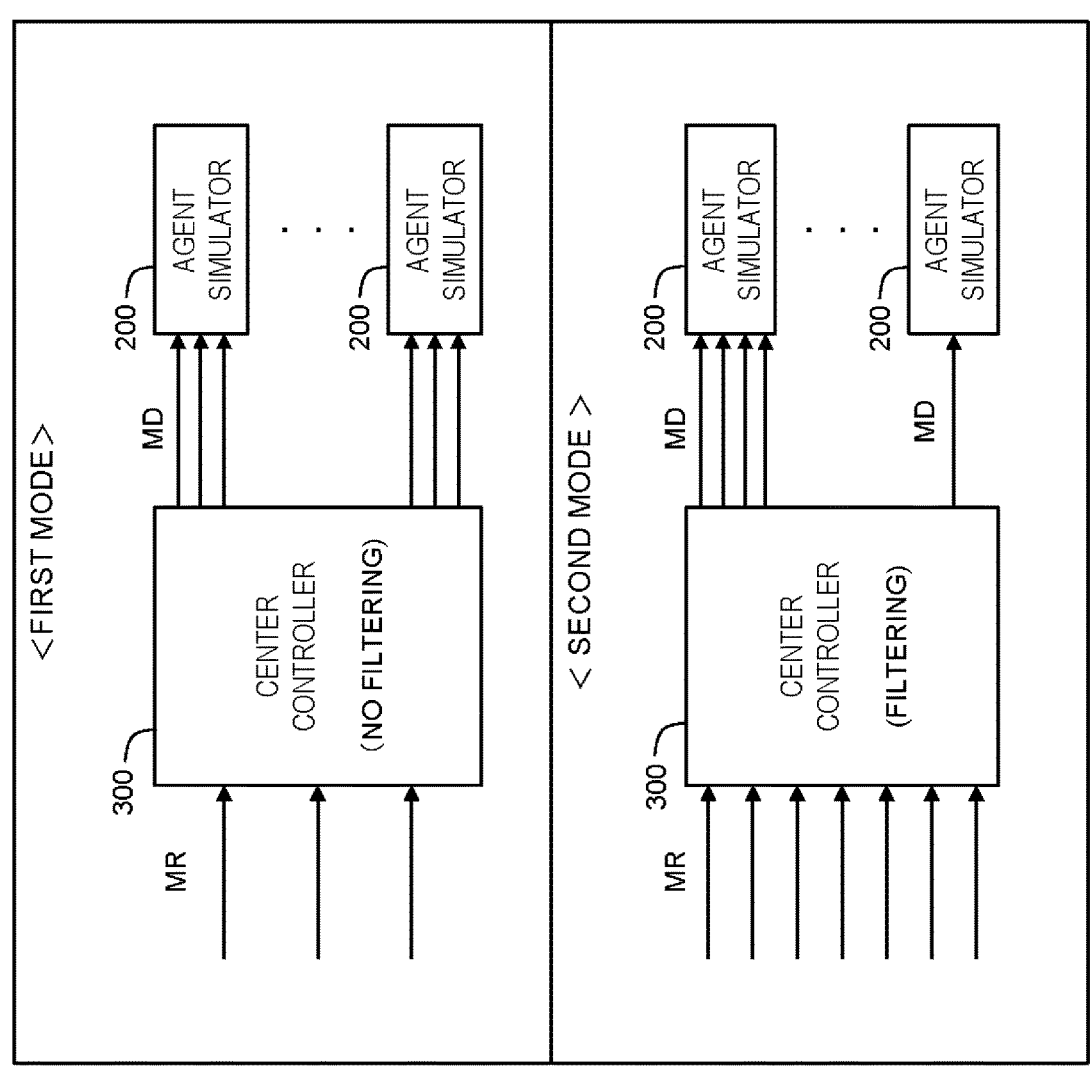
FIG. 13 is a conceptual diagram for explaining an example of mode switching in a center controller according to an embodiment of the present disclosure.

FIG. 13 is a conceptual diagram for explaining an example of the mode switching in the center controller 300. In the example shown in FIG. 13, the center controller 300 performs the mode switching based on the number of result messages MR that the center controller 300 receives per unit time.

More specifically, when the number of result messages MR that the center controller 300 receives per unit time is small, the delivery messages MD do not place a burden on a communication capacity, even when the result messages MR are delivered as the delivery messages MD without filtering. In view of the above, when the number of result messages MR that the center controller 300 receives per unit time is equal to or less than a threshold, the center controller 300 selects the first mode that does not perform the message filtering. More specifically, the center controller 300 turns OFF the function of the message filtering described in the above Section 2-1 or Section 2-2. Since the message filtering is not performed, the processing load in the center controller 300 is suppressed.

On the other hand, when the number of result messages MR that the center controller 300 receives per unit time is large, delivering the result messages MR as the delivery messages MD without filtering causes the increase in the traffic from the center controller 300 to the agent simulators 200 as a whole. In view of the above, when the number of result messages MR that the center controller 300 receives per unit time exceeds the threshold, the center controller 300 selects the second mode that performs the message filtering. In this case, the message filtering may be performed based on the temporal perspective (see Section 2-1) or may be performed based on the spatial perspective (see Section 2-2). Since the message filtering is performed, the traffic from the center controller 300 to the agent simulators 200 as a whole is effectively reduced.

When performing the mode switching, the center controller 300 may instruct the entire MAS system 100 to suspend the simulation. After the simulation is suspended, the center controller 300 performs the mode switching. When ready to restart, each agent simulator 200 notifies the center controller 300 of Restart Ready. When receiving the Restart Ready from all of the agent simulators 200, the center controller 300 instructs to restart the simulation.

A user of the MAS system 100 may instruct the center controller 300 to perform the mode switching. For example, the user instructs the center controller 300 to suspend the simulation. After the simulation is suspended, the user rewrites a mode setting file that specifies the operation mode. After that, the user instructs the center controller 300 to restart the simulation.

As described above, in one embodiment, the operation modes of the center controller 300 include the first mode that does not perform the message filtering and the second mode that performs the message filtering. The center controller

300 switches between the first mode and the second mode according to a situation. As a result, a flexible operation is possible in terms of the suppression of the traffic and the suppression of the processing load.

3. OVERALL CONFIGURATION EXAMPLE OF MAS SYSTEM

Figure 14:
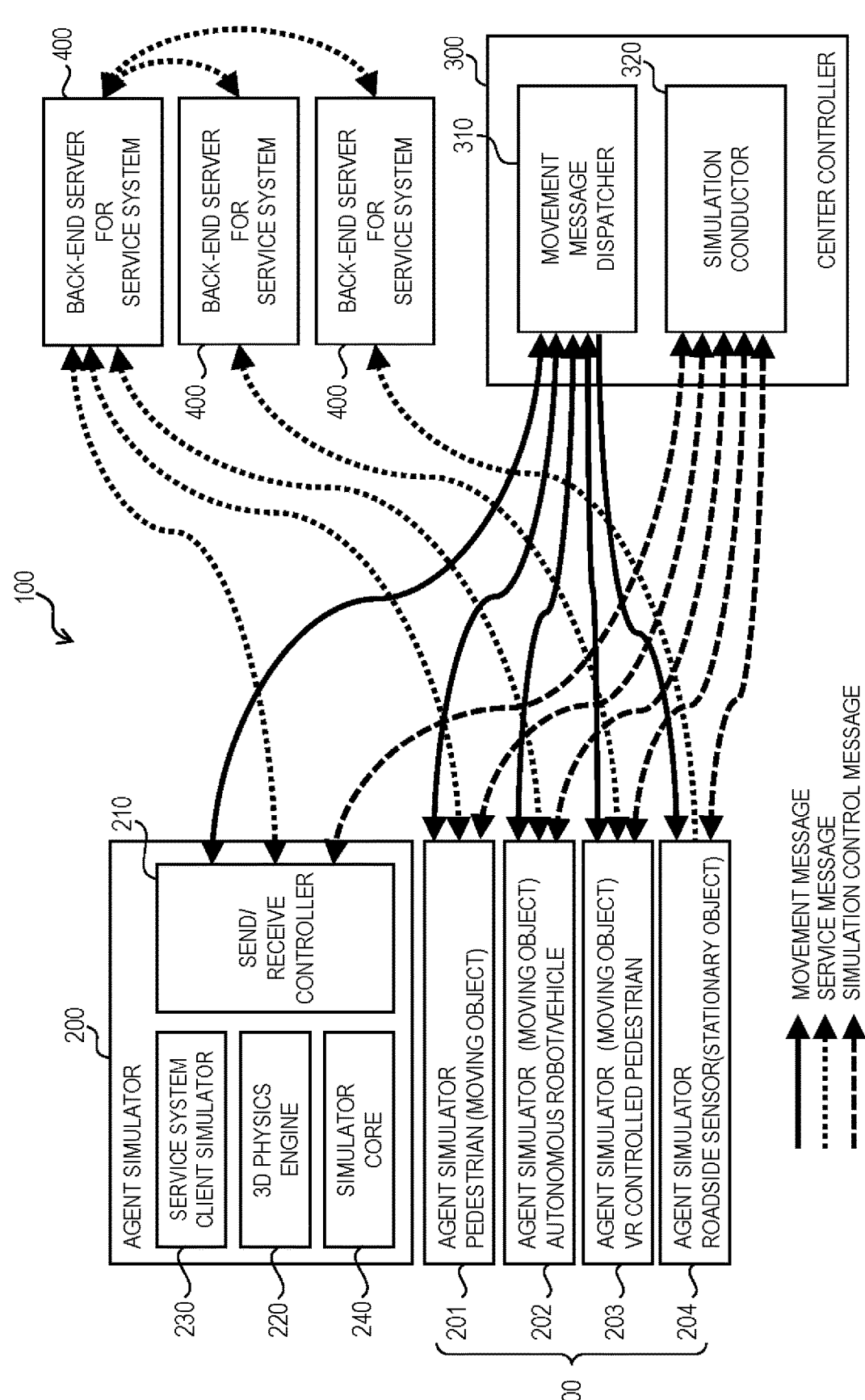
FIG. 14 is a block diagram showing an overall configuration of a multi-agent simulation system and information flow according to an embodiment of the present disclosure.

Hereinafter, an overall configuration of the MAS system 100 and flows of information will be described with reference to FIG. 14. As shown in FIG. 14, the MAS system 100 includes a plurality of agent simulators 200, a center controller 300, and a plurality of back-end servers 400 for a plurality of service systems. As will be described in detail later, these are distributed to a plurality of computers. In other words, the MAS system 100 is based on parallel distributed processing by a plurality of computers.

The center controller 300 includes, as its functions, a movement message dispatcher 310 and a simulation conductor 320. The center controller 300 is application software installed on the computer. The movement message dispatcher 310 and the simulation conductor 320 are programs constituting the application software. The center controller 300 and one or more agent simulators 200 may share a computer that is a hardware. Preferably, the center controller 300 exclusively uses one computer.

The movement message dispatcher 310 relays the communication of the movement messages between the agent simulators 200. A flow of information indicated by a solid line between the agent simulator 200 and the movement message dispatcher 310 indicates the flow of the movement message. The movement message dispatcher 310 is responsible for the above-described function of exchanging the movement message by the center controller 300. The movement message dispatcher 310 communicates with all the agent simulators 200 that constitute the MAS system 100. In addition, the movement message dispatcher 310 has the above-described function of the message filtering.

The simulation conductor 320 makes an initial setting for each agent simulator 200. In addition, the simulation conductor 320 controls the simulation in the agent simulator 200 by exchanging a simulation control message with the agent simulator 200. A flow of information indicated by a dashed line between the agent simulator 200 and the simulation conductor 320 is the flow of the simulation control message. The simulation conductor 320 communicates with all the agent simulators 200 constituting the MAS system 100 to exchange the simulation control message. Unlike the movement message is exchanged between the plurality of agent simulators 200 via the movement message dispatcher 310, the simulation control message is exchanged individually between the simulation conductor 320 and each agent simulator 200. For example, a simulation speed, stop of the simulation, suspension of the simulation, restart of the simulation, and the time granularity of the simulation are controlled by exchanging the simulation control message. The simulation speed is controlled for the entire MAS system 100, while the stop of the simulation, the suspension of the simulation, the restart of the simulation, and the time granularity of the simulation are controlled for each agent simulator 200.

The back-end server 400 is same as a back-end server actually used in the real-world service system. By bringing the real-world back-end server 400 into the virtual world, it is possible to simulate the service provided by the service system with high accuracy. Examples of the services simulated by the MAS system 100 include a mobility service such as an on-demand bus and a regular operation type bus utilizing an autonomous driving vehicle, and a logistics service for delivering a package utilizing an autonomous travel type robot. Another example of the service simulated by the MAS system 100 is one that a user is able to use by operating a service app on a user terminal.

The MAS system 100 includes the plurality of back-end servers 400 for different service systems, and thus is able to simulate multiple types of services at the same time in the virtual world 2. The simulation of the service is performed by exchanging a service message between the back-end server 400 and the agent simulator 200. A flow of information indicated by a dotted line between the agent simulator 200 and the back-end server 400 indicates the flow of the service message. Each back-end server 400 exchanges the service message with the agent simulator 200 associated with the service to be provided.

Contents of the service message to be exchanged vary depending on the type of the agent that the agent simulator 200 is responsible for. For example, when the agent is a user (pedestrian) using the service, the back-end server 400 receives the service message including service usage information from the agent simulator 200, and sends the service message including service provision status information to the agent simulator 200. The service usage information is information on a current status and a future plan of the usage of the service system by the user, and includes a current usage status and information input by an app operation. The service provision status information is information on a status of the user in the service system and is provided through the service app of the user terminal.

When the agent is an autonomous robot or an autonomous vehicle used for providing the service, the back-end server 400 receives the service message including operation status information from the agent simulator 200 and sends the service message including operation instruction information to the agent simulator 200. The operation status information is information on a current status and a future plan of the autonomous robot or the autonomous vehicle. Examples of the information on the current status include a status of an installed sensor, measured data, a status of an installed actuator, and a status of action determination. Examples of the information on the future plan include a list of future times, statuses of the actuator, and statuses of the action determination. The operation instruction information is information including all or a part of future plans for providing the service by utilizing the autonomous robot or the autonomous vehicle. Examples of the operation instruction information include a target point and a target path to and along which the autonomous robot or the autonomous vehicle should move.

The agents existing in the virtual world 2 include a stationary object such as a roadside sensor including a camera, an automatic door, and the like. For example, when the agent is a fixed camera, the back-end server 400 receives, from the agent simulator 200, the service message including image information captured by the fixed camera and necessary for calculating position information of the autonomous robot. As another example, when the agent is an automatic door, the back-end server 400 sends, to the agent simulator 200, the service message including an instruction to open the door for the passage of the autonomous robot.

In addition, the back-end server 400 exchanges the service message with other back-end servers 400 under respective agreements. A flow of information indicated by a dashed line between the back-end servers 400 indicates the flow of the service message. Examples of the service message exchanged here include a usage status by the user and a service provision status in each service. By exchanging the service message between the plurality of back-end servers 400, it is possible to link the services provided in the virtual world 2 with each other.

One example of the linkage between the plurality of services is a linkage between an on-demand bus service and a logistics service in which an autonomous robot carries a luggage from a bus stop to the user's home on behalf of the user. In the on-demand bus service, the user can get off the bus at a desired drop-off point at a desired time. The linkage between the on-demand bus service and the logistics service makes it possible to make the autonomous robot arrive at the drop-off point before the user's arrival and wait at the drop-off point. As another example, when the bus is delayed due to traffic jam or the like, or when the user misses the bus, exchanging the service message between the back-end servers 400 makes it possible to adjust a target time at which the autonomous robot arrives at the drop-off point to be in line with the user's arrival time.

There are multiple types of agent simulators 200 for multiple types of agents to be simulated. For example, there are an agent simulator 201 for a pedestrian agent, an agent simulator 202 for an autonomous robot/vehicle agent, an agent simulator 203 for a VR controlled pedestrian agent, and an agent simulator 204 for a roadside sensor agent. Hereinafter, the agent simulator 200 is a general term for the multiple types of agent simulators 201, 202, 203, and 204.

The agent simulator 200 includes, as its function, a send/receive controller 210, a 3D physics engine 220, a service system client simulator 230, and a simulator core 240. The agent simulator 200 is application software installed on the computer. The send/receive controller 210, the 3D physics engine 220, the service system client simulator 230, and the simulator core 240 are programs constituting the application software. These functions are different between the agent simulators 201, 202, 203 and 204. Common functions between the agent simulators 201, 202, 203, and 204 will be described here, and details of the respective functions of the agent simulators 201, 202, 203, and 204 will be described later.

The send/receive controller 210 is an interface between the agent simulator 200 and other programs. The send/receive controller 210 receives the movement message from the movement message dispatcher 310 and sends the movement message to the movement message dispatcher 310. However, in the agent simulator 204, only the receiving of the movement message is performed. The send/receive controller 210 receives the simulation control message from the simulation conductor 320 and sends the simulation control message to the simulation conductor 320. The send/receive controller 210 receives the service message from the back-end server 400 and sends the service message to the back-end server 400. However, in the agent simulator 204, only the sending of the service message is performed.

The 3D physics engine 220 estimates a current status of a surrounding agent in a three-dimensional space based on the movement message received from another agent simulator 200. The estimation of the current status based on the past status of the surrounding agent described with reference to FIG. 3 is performed by the 3D physics engine 220. The 3D physics engine 220 generates surroundings information acquired by observation from the subject agent, based on the current status of the surrounding agent. Further, the 3D physics engine 220 updates the status of the subject agent in the three-dimensional space based on a result of simulation by the simulator core 240 to be described later, and generates the movement message indicating the status of the subject agent. However, in the agent simulator 204, the update of the status of the subject agent and the generation of the movement message are not performed, because the subject agent to be simulated does not move.

The service system client simulator 230 simulates a behavior of the subject agent being a client of the service system associated with the back-end server 400. The service message received by the send/receive controller 210 is input to the service system client simulator 230. Then, the service message generated by the service system client simulator 230 is sent from the send/receive controller 210. However, in the agent simulator 204, only the generation of the service message is performed.

The simulator core 240 simulates the status of the subject agent in the next time step. A time interval between the time steps for calculating the status of the subject agent is the time granularity described above. Contents of the simulation in the simulator core 240 differ for each type of the agent simulator 200. It should be noted that the agent simulator 204 does not have the simulator core 240, because the agent to be simulated does not move and the simulation of the status of the subject agent is not necessary.

4. CONCRETE EXAMPLES OF AGENT SIMULATOR

Next, a detailed configuration of and flows of information in each of the multiple types of the agent simulators 201, 202, 203, and 204 constituting the MAS system 100 will be described with reference to FIGS. 15 to 18. It should be noted that in FIGS. 15 to 18, a flow of information indicated by a solid line between blocks indicates the flow of movement message. A flow of information indicated by a dotted line between blocks indicates the flow of the service message. A flow of information indicated by a dashed line between blocks indicates the flow of the simulation control message.

4-1. Agent Simulator for Pedestrian Agent

Figure 15:
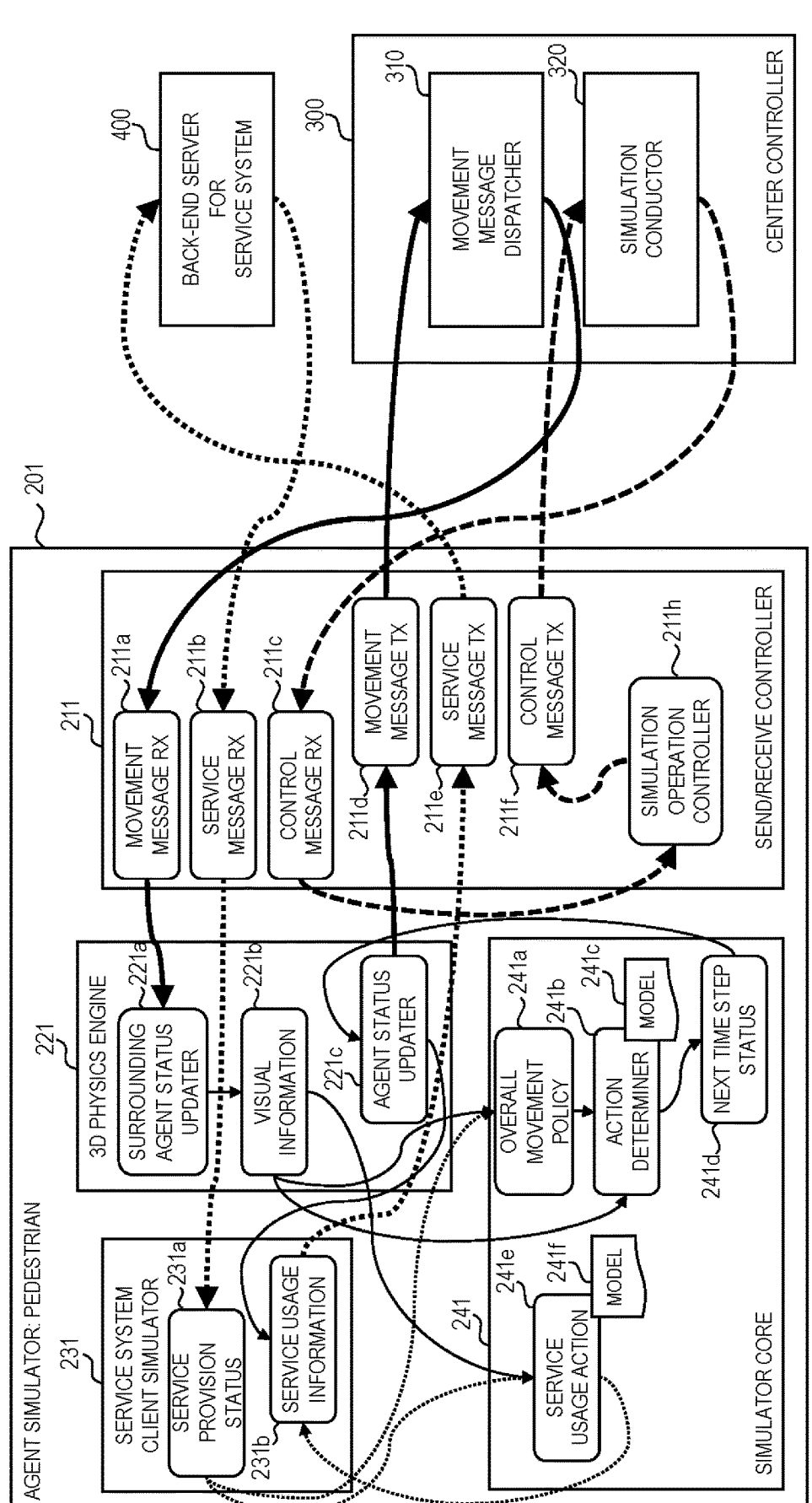
FIG. 15 is a block diagram showing a configuration of an agent simulator for a pedestrian agent and information flow according to an embodiment of the present disclosure.

FIG. 15 is a block diagram showing a configuration of the agent simulator 201 for the pedestrian agent and a flow of information. Hereinafter, an overall configuration and details of each part of the agent simulator 201 for the pedestrian agent, and the flow of information in the agent simulator 201 will be described.

4-1-1. Overall Configuration of Agent Simulator for Pedestrian Agent

The agent simulator 201 includes, as its functions, a send/receive controller 211, a 3D physics engine 221, a service system client simulator 231, and a simulator core 241. These functions are conceptually included in the send/receive controller 210, the 3D physics engine 220, the service system client simulator 230, and the simulator core 240, respectively.

The send/receive controller 211 includes a movement message receiver 211a, a service message receiver 211b, and a control message receiver 211c as functions for receiving a variety of messages. The send/receive controller 211 includes a movement message sender 211d, a service message sender 211e, and a control message sender 211f as functions for sending a variety of messages. The send/receive controller 211 further includes a simulation operation controller 211h. Each of the units 211a to 211h constituting the send/receive controller 211 is a program or a part of a program.

The 3D physics engine 221 includes, as its functions, a surrounding agent status updater 221a, a visual information generator 221b, and a subject agent status updater 221c. Each of the units 221a, 221b, and 221c constituting the 3D physics engine 221 is a program or a part of a program.

The service system client simulator 231 includes, as its functions, a service provision status information processor 231a and a service usage information generator 231b. Each of the units 231a and 231b constituting the service system client simulator 231 is a program or a part of a program.

The simulator core 241 includes, as its functions, an overall movement policy determiner 241a, an action determiner 241b, a next time step status calculator 241d, and a service usage action determiner 241e. Each of the units 241a, 241b, 241d, and 241e constituting the simulator core 241 is a program or a part of a program.

4-1-2. Details of Send/Receive Controller

In the send/receive controller 211, the movement message receiver 211a receives the movement message from the movement message dispatcher 310. The movement message receiver 211a outputs the received movement message to a surrounding agent status updater 221a of the 3D physics engine 221.

The service message receiver 211b receives the service message from the back-end server 400. The service message receiver 211b outputs the received service message to the service provision status information processor 231a of the service system client simulator 231.

The control message receiver 211c receives the simulation control message from the simulation conductor 320. The control message receiver 211c outputs the received simulation control message to the simulation operation controller 211h.

The movement message sender 211d acquires the movement message including the current status of the subject agent from the subject agent status updater 221c of the 3D physics engine 221. The movement message sender 211d sends the acquired movement message to the movement message dispatcher 310.

The service message sender 211e acquires the service message including service usage information from the service usage information generator 231b of the service system client simulator 231. The service message sender 211e sends the acquired service message to the back-end server 400.

The control message sender 211f acquires the simulation control message including the control status of the agent simulator 201 from the simulation operation controller 211h. The control message sender 211f sends the simulation control message acquired from the simulation operation controller 211h to the simulation conductor 320.

The simulation operation controller 211h acquires the simulation control message from the control message receiver 211c. The simulation operation controller 211h controls the simulation operation of the agent simulator 201 in accordance with an instruction included in the simulation control message. For example, when the change of the time granularity of the simulation is instructed, the simulation operation controller 211h changes the time granularity of the simulation by the agent simulator 201 from an initial value to the instructed time granularity. The initial value of the time granularity is stored as a set value in the agent simulator 201. An upper limit and a lower limit of the time granularity for each type of agent are stored in the simulation conductor 320.

When the instruction content of the simulation control message is the simulation speed, the simulation operation controller 211h accelerates or decelerates a simulation speed by changing operating frequencies of the 3D physics engine 221 and the simulator core 241. The simulation speed means a speed ratio of a time flow of the virtual world 2 to a time flow of the real world. When the stop of the simulation is instructed, the simulation operation controller 211*h* stops the simulation by the agent simulator 201. When the stop of the simulation is instructed, the simulation is stopped. When restart is instructed, the simulation is restarted. The simulation operation controller 211*h* outputs the simulation control message including the current control status of the agent simulator 201 to the control message sender 211*f.*

4-1-3. Details of 3D Physics Engine

In the 3D physics engine 221, the surrounding agent status updater 221*a* acquires the movement message from the movement message receiver 211*a*. The movement message acquired from the movement message receiver 211*a* is the movement message sent from another agent simulator via the movement message dispatcher 310. The surrounding agent status updater 221*a* estimates the current status of the surrounding agent existing around the subject agent based on the acquired movement message.

When the current status of the surrounding agent is estimated from the past status, the surrounding agent status updater 221*a* uses the past status of the surrounding agent stored in a log. The method of estimating the current status by the use of the past status of the surrounding agent is as described with reference to FIG. 3. The surrounding agent status updater 221*a* outputs the estimated current status of the surrounding agent to the visual information generator 221*b* and updates the log.

The visual information generator 221*b* acquires the current status of the surrounding agent from the surrounding agent status updater 221*a*. The visual information generator 221*b* generates surroundings information acquired by observation from the subject agent, based on the current status of the surrounding agent. Since the subject agent is a pedestrian, the surroundings information acquired by observation means visual information captured by the pedestrian's eyes. The visual information generator 221*b* outputs the generated visual information to the overall movement policy determiner 241*a*, the action determiner 241*b*, and the service usage action determiner 241*e* of the simulator core 241.

The subject agent status updater 221*c* acquires the status of the subject agent in the next time step simulated by the simulator core 241 from the next time step status calculator 241*d* of the simulator core 241. The subject agent status updater 221*c* updates the status of the subject agent in the three-dimensional space based on the result of simulation by the simulator core 241. The subject agent status updater 221*c* outputs the movement message including the updated status of the subject agent to the movement message sender 211*d* of the send/receive controller 211. The status of the subject agent included in the movement message includes a position, a direction, a speed, and an acceleration in the current time step, and a position, a direction, a speed, and an acceleration in the next time step. In addition, the subject agent status updater 221*c* outputs the information on the updated status of the subject agent to the service usage information generator 231*b* of the service system client simulator 231.

4-1-4. Details of Service System Client Simulator

In the service system client simulator 231, the service provision status information processor 231*a* acquires the service message from the service message receiver 211*b*. The service message acquired from the service message receiver 211*b* includes service provision status information. The service provision status information processor 231*a* processes the service provision status information, and acquires information on the status of the subject agent as the user of the service system and an item input to the service app of the user terminal. The information on the status of the subject agent as the user is information presented to the user terminal, and the input item is information requested to the subject agent to input for using the service. The service provision status information processor 231*a* outputs the information on the status of the subject agent as the user and the item input to the service app of the user terminal to the overall movement policy determiner 241*a* and the service usage action determiner 241*e* of the simulator core 241.

The service usage information generator 231*b* acquires a result of determination of the service usage action of the subject agent from the service usage action determiner 241*e* of the simulator core 241. In addition, the service usage information generator 231*b* acquires the status of the subject agent in the three-dimensional space from the subject agent status updater 221*c* of the 3D physics engine 221. The service usage information generator 231*b* generates service usage information based on the acquired information and updates the service usage status of the subject agent. The service usage information generator 231*b* outputs the service message including the service usage information to the service message sender 211*e* of the send/receive controller 211.

4-1-5. Details of Simulator Core

In the simulator core 241, the overall movement policy determiner 241*a* acquires the visual information from the visual information generator 221*b* of the 3D physics engine 221. In addition, the overall movement policy determiner 241*a* acquires the information on the status of the subject agent as the user and the item input to the service app of the user terminal, from the service provision status information processor 231*a* of the service system client simulator 231. The overall movement policy determiner 241*a* determines an overall movement policy of the subject agent in the virtual world 2 based on the acquired information. The overall movement policy determiner 241*a* outputs the determined overall movement policy to the action determiner 241*b*.

The action determiner 241*b* acquires the overall movement policy from the overall movement policy determiner 241*a*, and acquires the visual information from the visual information generator 221*b* of the 3D physics engine 221. The action determiner 241*b* determines an action of the subject agent by inputting the overall movement policy and the visual information to a movement model 241*c*. The movement model 241*c* is a simulation model obtained by modeling how a pedestrian moves according to surrounding situations captured by the pedestrian's eye under a certain movement policy. The action determiner 241*b* outputs the determined action of the subject agent to the next time step status calculator 241*d.*

The next time step status calculator 241*d* acquires the action of the subject agent determined by the action determiner 241*b*. The next time step status calculator 241*d* calculates the status of the subject agent in the next time step based on the action of the subject agent. The status of the subject agent to be calculated includes the position, the direction, the speed, and the acceleration of the subject agent in the next time step. The next time step status calculator 241*d* outputs the calculated status of the subject agent in the next time step to the subject agent status updater 221*c* of the 3D physics engine 221.

The service usage action determiner 241*e* acquires the visual information from the visual information generator 221*b* of the 3D physics engine 221. In addition, the service usage action determiner 241*e* acquires the information on the status of the subject agent as the user and the item input to the service app of the user terminal, from the service provision status information processor 231a of the service system client simulator 231. The service usage action determiner 241e inputs the acquired information to an action model 241f to determine the action (service usage action) of the subject agent as the user of the service system. The action model 241f is a simulation model obtained by modeling how the user moves according to the surrounding situation captured by the user's eye when information on the service is presented to the user and input to the service app of the user terminal is requested. The service usage action determiner 241e outputs the determined service usage action to the service usage information generator 231b.

4-2. Agent Simulator for Autonomous Robot/Vehicle Agent

Figure 16:
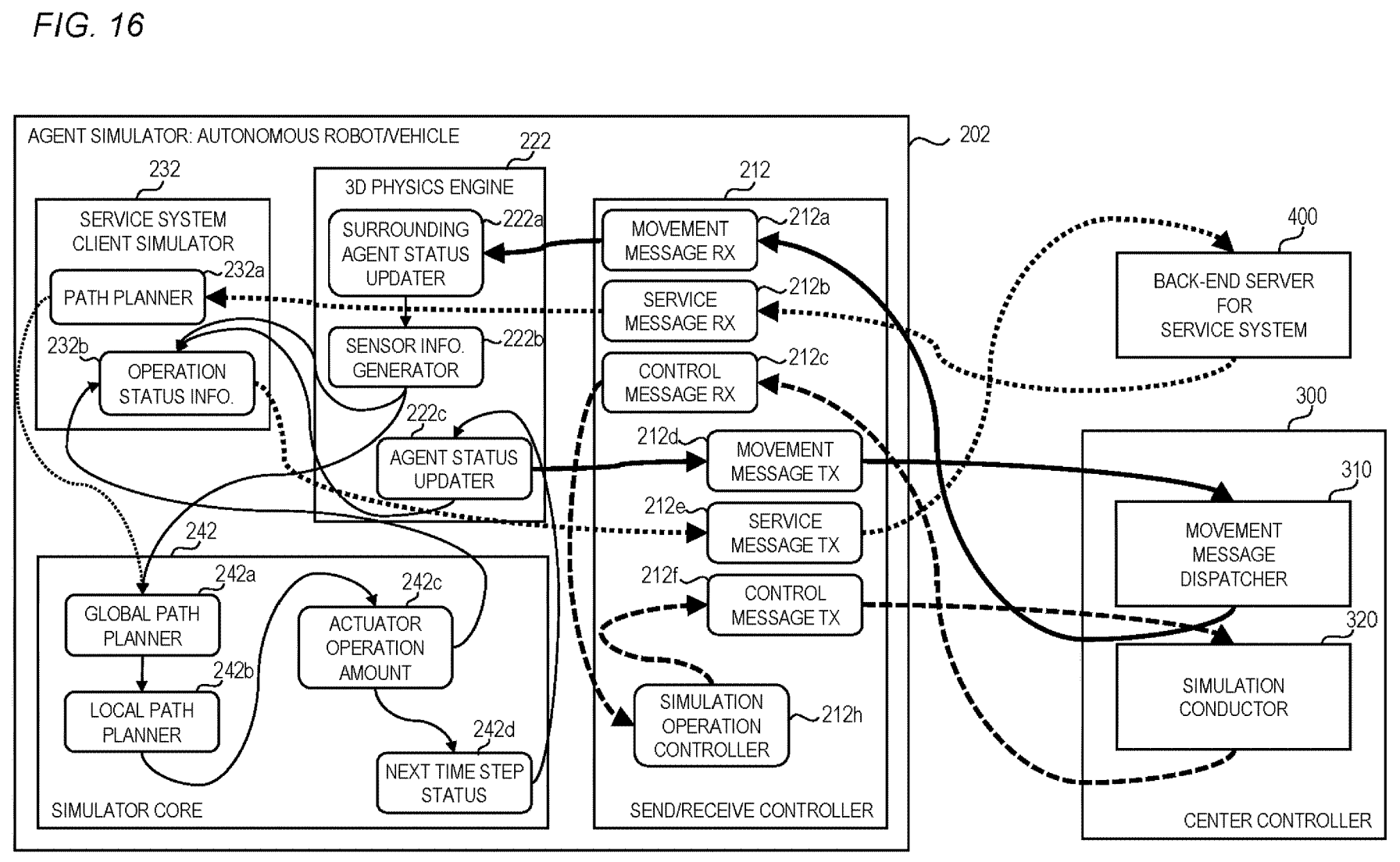

FIG. 16 is a block diagram showing a configuration of the agent simulator 202 for the autonomous robot/vehicle agent and a flow of information. The autonomous robot/vehicle agent is an agent corresponding to an autonomous robot or an autonomous vehicle used for providing the service in the service system associated with the back-end server 400. Hereinafter, an overall configuration and details of each part of the agent simulator 202 for the autonomous robot/vehicle agent, and the flow of information in the agent simulator 202 will be described.

4-2-1. Overall Configuration of Agent Simulator for Autonomous Robot/Vehicle Agent The agent simulator 202 includes, as its functions, a send/receive controller 212, a 3D physics engine 222, a service system client simulator 232, and a simulator core 242. These functions are conceptually included in the send/receive controller 210, the 3D physics engine 220, the service system client simulator 230, and the simulator core 240, respectively.

The send/receive controller 212 includes a movement message receiver 212a, a service message receiver 212b, and a control message receiver 212c as functions for receiving a variety of messages. The send/receive controller 212 includes a movement message sender 212d, a service message sender 212e, and a control message sender 212f as functions for sending a variety of messages. The send/receive controller 212 further includes a simulation operation controller 212h. Each of the units 212a to 212h constituting the send/receive controller 211 is a program or a part of a program.

The 3D physics engine 222 includes, as its functions, a surrounding agent status updater 222a, a sensor information generator 222b, and a subject agent status updater 222c. Each of the units 222a, 222b, and 222c constituting the 3D physics engine 222 is a program or a part of a program.

The service system client simulator 232 includes, as its functions, a path planning information receiver 232a and an operation status information generator 232b. Each of the units 232a and 232b constituting the service system client simulator 232 is a program or a part of a program.

The simulator core 242 includes, as its functions, a global path planner 242a, a local path planner 242b, an actuator operation amount determiner 242c, and a next time step status calculator 242d. Each of the units 242a, 242b, 242c, and 242d constituting the simulator core 242 is a program or a part of a program.

4-2-2. Details of Send/Receive Controller

In the send/receive controller 212, the movement message receiver 212a receives the movement message from the movement message dispatcher 310. The movement message receiver 212a outputs the received movement message to the surrounding agent status updater 222a of the 3D physics engine 222.

The service message receiver 212b receives the service message from the back-end server 400. The service message receiver 212b outputs the received service message to the path planning information receiver 232a of the service system client simulator 232.

The control message receiver 212c receives the simulation control message from the simulation conductor 320. The control message receiver 212c outputs the received simulation control message to the simulation operation controller 212h.

The movement message sender 212d acquires the movement message including the current status of the subject agent from the subject agent status updater 222c of the 3D physics engine 222. The movement message sender 212d sends the acquired movement message to the movement message dispatcher 310.

The service message sender 212e acquires the service message including operation status information from the operation status information generator 232b of the service system client simulator 232. The service message sender 212e sends the acquired service message to the back-end server 400.

The control message sender 212f acquires the simulation control message including the control status of the agent simulator 202 from the simulation operation controller 212h. The control message sender 212f sends the simulation control message acquired from the simulation operation controller 212h to the simulation conductor 320.

The simulation operation controller 212h acquires the simulation control message from the control message receiver 212c. The simulation operation controller 212h controls the simulation operation of the agent simulator 202 in accordance with an instruction included in the simulation control message. For example, when the change of the time granularity of the simulation is instructed, the simulation operation controller 212h changes the time granularity of the simulation by the agent simulator 202 from an initial value to the instructed time granularity. The initial value of the time granularity is stored as a set value in the agent simulator 202. An upper limit and a lower limit of the time granularity for each type of agent are stored in the simulation conductor 320.

When the instruction content of the simulation control messages is the simulation speed, the simulation operation controller 212h accelerates or decelerates a computation speed of the agent simulator 202 by changing operating frequencies of the 3D physics engine 222 and the simulator core 242 in accordance with the instructed simulation speed. When the stop of the simulation is instructed, the simulation operation controller 212h stops the simulation by the agent simulator 202. When the stop of the simulation is instructed, the simulation is stopped. When restart is instructed, the simulation is restarted. The simulation operation controller 212h outputs the simulation control message including the current control status of the agent simulator 202 to the control message sender 212f.

4-2-3. Details of 3D Physics Engine

In the 3D physics engine 222, the surrounding agent status updater 222a acquires the movement message from the movement message receiver 212a. The movement message acquired from on the movement message receiver 212a is a movement message sent from another agent simulator via the movement message dispatcher 310. The surrounding agent status updater 222a estimates the current status of the surrounding agent existing around the subject agent based on the acquired movement message.

When the current status of the surrounding agent is estimated from the past status, the surrounding agent status updater 222a uses the past status of the surrounding agent stored in a log. The method of estimating the current status by the use of the past status of the surrounding agent is as described with reference to FIG. 3. The surrounding agent status updater 222a outputs the estimated current status of the surrounding agent to the sensor information generator 222b and updates the log.

The sensor information generator 222b acquires the current status of the surrounding agent from the surrounding agent status updater 222a. The sensor information generator 222b generates surroundings information acquired by observation from the subject agent, based on the current status of the surrounding agent. Since the subject agent is an autonomous robot or an autonomous vehicle, the surroundings information acquired by observation means sensor information captured by a sensor of the autonomous robot or the autonomous vehicle. The sensor information generator 222b outputs the generated sensor information to the global path planner 242a of the simulator core 242 and the operation status information generator 232b of the service system client simulator 232.

The subject agent status updater 222c acquires the status of the subject agent in the next time step calculated by the simulator core 242 from the next time step status calculator 242d of the simulator core 242. The subject agent status updater 222c updates the status of the subject agent in the three-dimensional space based on the result of calculation by the simulator core 242. The subject agent status updater 222c outputs the movement message including the updated status of the subject agent to the movement message sender 212d of the send/receive controller 212. The status of the subject agent included in the movement message includes a position, a direction, a speed, and an acceleration in the current time step, and a position, a direction, a speed, and an acceleration in the next time step. In addition, the subject agent status updater 222c outputs the information on the updated status of the subject agent to the operation status information generator 232b of the service system client simulator 232.

4-2-4. Details of Service System Client Simulator

In the service system client simulator 232, the path planning information receiver 232a acquires the service message from the service message receiver 211b. The service message acquired from the service message receiver 212b includes operation instruction information for the service system to provide the service by using the autonomous robot/vehicle, and information on other service systems. The path planning information receiver 232a outputs the operation instruction information and the information on the other service systems to the global path planner 242a of the simulator core 242.

The operation status information generator 232b acquires an actuator operation amount of the subject agent in the next time step from the actuator operation amount determiner 242c of the simulator core 242. The operation status information generator 232b acquires the sensor information from the sensor information generator 222b of the 3D physics engine 222, and acquires the status of the agent in the three-dimensional space from the agent status updater 222c. The operation status information generator 232b generates operation status information indicating the operation status of the subject agent regarding the service provision based on the acquired information. The operation status information generator 232b outputs the service message including the operation status information to the service message sender 212e of the send/receive controller 212.

4-2-5. Details of Simulator Core

In the simulator core 242, the global path planner 242a acquires the sensor information from the sensor information generator 222b of the 3D physics engine 222. The global path planner 242a acquires the operation instruction information and the information of the other service systems from the path planning information receiver 232a of the service system client simulator 232. The global path planner 242a plans a global path of subject agent in the virtual world 2 based on the acquired information. The global path means a path from a current position of the subject agent to a target point. Since the information acquired from the sensor information generator 222b and the path planning information receiver 232a changes every time, the global path planner 242a replans the global path plan every time step. The global path planner 242a outputs the determined global path plan to the local path planner 242b.

The local path planner 242b acquires the global path plan from the global path planner 242a. The local path planner 242b makes a local path plan based on the global path plan. For example, the local path means a path until a predetermine time steps after a current time, or a path for a predetermined distance from the current position. The local path plan is represented by, for example, a set of positions to be traced by the subject agent and a speed or an acceleration at each position. The local path planner 242b outputs the determined local path plan to the actuator operation amount determiner 242c.

The actuator operation amount determiner 242c acquires the local path plan from the local path planner 242b. The actuator operation amount determiner 242c determines an actuator operation amount of subject agent in the next time step based on the local path plan. The actuator here is an actuator that controls the direction, the speed, and the acceleration of the subject agent. When the autonomous agent is an autonomous robot or an autonomous vehicle running on wheels, for example, actuators such as a braking device, a driving device, and a steering device are operated. The actuator operation amount determiner 242c outputs the determined actuator operation amount to the next time step status calculator 242d and the operation status information generator 232b of the service system client simulator 232.

The next time step status calculator 242d acquires the actuator operation amount determined by the actuator operation amount determiner 242c. The next time step status calculator 242d calculates the status of the subject agent in the next time step based on the actuator operation amount. The status of the subject agent to be calculated includes the position, the direction, the speed, and the acceleration of the subject agent in the next time step. The next time step status calculator 242d outputs the calculated status of the subject agent in the next time step to the subject agent status updater 222c of the 3D physics engine 222.

4-3. Agent Simulator for VR Controlled Pedestrian Agent

Figure 17:
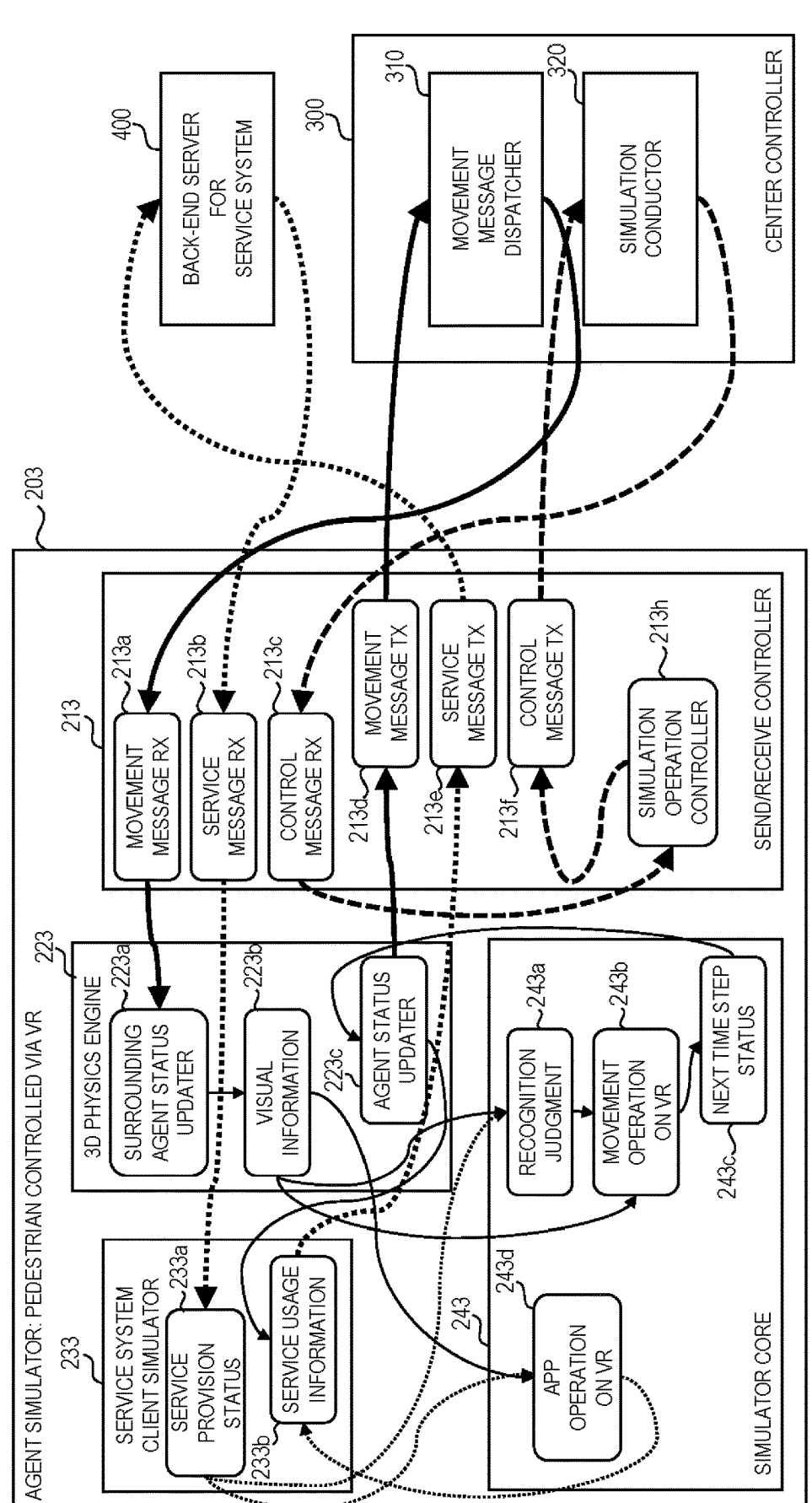
FIG. 17 is a block diagram showing a configuration of an agent simulator for a VR controlled pedestrian agent and information flow according to an embodiment of the present disclosure.

FIG. 17 is a block diagram showing a configuration of the agent simulator 203 for the VR controlled pedestrian agent and a flow of information. The VR controlled pedestrian agent is a pedestrian agent for a real person to participate in the virtual world 2 being the target of the simulation by the use of a VR (Virtual Reality) system. Hereinafter, an overall configuration and details of each part of the agent simulator 203 for the VR controlled pedestrian agent, and the flow of information in the agent simulator 203 will be described.

4-3-1. Overall Configuration of Agent Simulator for VR Controlled Pedestrian Agent The agent simulator 203 includes, as its functions, a send/receive controller 213, a 3D physics engine 223, a service system client simulator 233, and a simulator core 243. These functions are conceptually included in the send/receive controller 210, the 3D physics engine 220, the service system client simulator 230, and the simulator core 240, respectively.

The send/receive controller 213 includes a movement message receiver 213a, a service message receiver 213b, and a control message receiver 213c as functions for receiving a variety of messages. The send/receive controller 213 includes a movement message sender 213d, a service message sender 213e, and a control message sender 213f as functions for sending a variety of messages. The send/receive controller 213 further includes a simulation operation controller 213h. Each of the units 213a to 213h constituting the send/receive controller 213 is a program or a part of a program.

The 3D physics engine 223 includes, as its functions, a surrounding agent status updater 223a, a visual information generator 223b, and a subject agent status updater 223c. Each of the units 223a, 223b, and 223c constituting the 3D physics engine 223 is a program or a part of a program.

The service system client simulator 233 includes, as its functions, a service provision status information processor 233a and a service usage information generator 233b. Each of the units 233a and 233b constituting the service system client simulator 231 is a program or a part of a program.

The simulator core 243 includes, as its functions, a recognition and judgment information presenter 243a, a movement operation receiver 243b, a next time step status calculator 243c, and an app operation receiver 243d. Each of the units 243a, 243b, 243c, and 243d constituting the simulator core 243 is a program or a part of a program.

4-3-2. Details of Send/Receive Controller

In the send/receive controller 213, the movement message receiver 213a receives the movement message from the movement message dispatcher 310. The movement message receiver 213a outputs the received movement message to the surrounding agent status updater 223a of the 3D physics engine 223.

The service message receiver 213b receives the service message from the back-end server 400. The service message receiver 213b outputs the received service message to the service provision status information processor 233a of the service system client simulator 233.

The control message receiver 213c receives the simulation control message from the simulation conductor 320. The control message receiver 213c outputs the received simulation control message to the simulation operation controller 213h.

The movement message sender 213d acquires the movement message including the current status of the subject agent from the subject agent status updater 223c of the 3D physics engine 223. The movement message sender 213d sends the acquired movement message to the movement message dispatcher 310.

The service message sender 213e acquires the service message including service usage information from the service usage information generator 233b of the service system client simulator 233. The service message sender 213e sends the acquired service message to the back-end server 400.

The control message sender 213f acquires the simulation control message including the control status of the agent simulator 203 from the simulation operation controller 213h.

The control message sender 213f sends the simulation control message acquired from the simulation operation controller 213h to the simulation conductor 320.

The simulation operation controller 213h acquires the simulation control message from the control message receiver 213c. The simulation operation controller 213h controls the simulation operation of the agent simulator 203 in accordance with an instruction included in the simulation control message. When a condition that the VR controlled pedestrian agent participates in the virtual world 2 is not satisfied, the simulation conductor 320 instructs the agent simulator 203 to stop the simulation.

The agent simulators 201 and 202 described above and the agent simulator 204 described later can change the simulation speed as necessary. However, when the simulation speed is changed, a real participant participating in the virtual world 2 via the VR controlled pedestrian agent may strongly feel a sense of strangeness about the time flow different from that in the real world. Therefore, in the MAS system 100, the VR controlled pedestrian agent is allowed to participate in the virtual world 2 on condition that the simulation is being performed based on the actual time. When the simulation speed is accelerated or decelerated as compared with the time flow in the real world, the simulation conductor 320 stops the simulation by the agent simulator 203. The simulation operation controller 213h outputs the simulation control message including the current control status of the agent simulator 203 to the control message sender 213f.

4-3-3. Details of 3D Physics Engine

In the 3D physics engine 223, the surrounding agent status updater 223a acquires the movement message from the movement message receiver 213a. The movement message acquired from on the movement message receiver 213a is a movement message sent from another agent simulator via the movement message dispatcher 310. The surrounding agent status updater 223a estimates the current status of the surrounding agent existing around the subject agent based on the acquired movement message.

When the current status of the surrounding agent is estimated from the past status, the surrounding agent status updater 223a uses the past status of the surrounding agent stored in a log. The method of estimating the current status by the use of the past status of the surrounding agent is as described with reference to FIG. 3. The surrounding agent status updater 223a outputs the estimated current status of the surrounding agent to the visual information generator 223b and updates the log.

The visual information generator 223b acquires the current status of the surrounding agent from the surrounding agent status updater 223a. The visual information generator 223b generates surroundings information acquired by observation from the subject agent, based on the current status of the surrounding agent. Since the subject agent is a pedestrian, the surroundings information acquired by observation means visual information captured by the pedestrian's eyes. The visual information generator 223b outputs the generated visual information to the recognition and judgment information presenter 243a and the movement operation receiver 243b of the simulator core 243.

The subject agent status updater 223c acquires the status of the subject agent in the next time step calculated by the simulator core 243 from the next time step status calculator 243c of the simulator core 243. The subject agent status updater 223c updates the status of the subject agent in the three-dimensional space based on the result of calculation by the simulator core 243. The subject agent status updater 223*c* outputs the movement message including the updated status of the subject agent to the movement message sender 213*d* of the send/receive controller 213. The status of the subject agent included in the movement message includes a position, a direction, a speed, and an acceleration in the current time step, and a position, a direction, a speed, and an acceleration in the next time step. In addition, the subject agent status updater 223*c* outputs the information on the updated status of the subject agent to the service usage information generator 233*b* of the service system client simulator 233.

4-3-4. Details of Service System Client Simulator

In the service system client simulator 233, the service provision status information processor 233*a* acquires the service message from the service message receiver 213*b*. The service message acquired from the service message receiver 213*b* includes service provision status information. The service provision status information processor 233*a* processes the service provision status information, and acquires information on the status of the subject agent as the user of the service system and an item input to the service app of the user terminal. The information on the status of the subject agent as the user is information presented to the user terminal, and the input item is information requested by the subject agent to input for using the service. The service provision status information processor 233*a* outputs the information on the status of the subject agent as the user and the item input to the service app of the user terminal to the recognition and judgment information presenter 243*a* and the app operation receiver 243*d* of the simulator core 243.

The service usage information generator 233*b* acquires, from the app operation receiver 243*d* of the simulator core 243, a service app operation on the VR by the real participant participating in the virtual world 2 via the VR controlled pedestrian agent. In addition, the service usage information generator 233*b* acquires the status of the subject agent in the three-dimensional space from the subject agent status updater 223*c* of the 3D physics engine 223. The service usage information generator 233*b* generates service usage information based on the acquired information and updates the service usage status of the subject agent. The service usage information generator 233*b* outputs the service message including the service usage information to the service message sender 213*e* of the send/receive controller 213.

4-3-5. Details of Simulator Core

In the simulator core 243, the recognition and judgment information presenter 243*a* acquires the visual information from the visual information generator 223*b* of the 3D physics engine 223. In addition, the recognition and judgment information presenter 243*a* acquires the information on the status of the subject agent as the user and the item input to the service app of the user terminal, from the service provision status information processor 233*a* of the service system client simulator 231. The acquired information is information used for recognition and judgment by the real participant participating in virtual world 2 via the VR controlled pedestrian agent. The recognition and judgment information presenter 243*a* presents the information for recognition and judgment to the real participant via the VR system.

The movement operation receiver 243*b* acquires the visual information from the visual information generator 223*b* of the 3D physics engine 223. Then, the movement operation receiver 243*b* presents the visual information to the real participant via the VR system, and receives an movement operation on the VR by the real participant. The movement operation receiver 243*b* outputs the received movement operation on the VR by the real participant to the next time step status calculator 243*d*.

The next time step status calculator 243*d* acquires the movement operation on the VR by the real participant from the movement operation receiver 243*b*. The next time step status calculator 243*d* calculates the status of the subject agent in the next time step based on the movement operation on the VR by the real participant. The status of the subject agent to be calculated includes the position, the direction, the speed, and the acceleration of the subject agent in the next time step. The next time step status calculator 243*d* outputs the calculated status of the subject agent in the next time step to the subject agent status updater 223*c* of the 3D physics engine 223.

The app operation receiver 243*d* acquires the visual information from the visual information generator 223*b* of the 3D physics engine 223. In addition, the app operation receiver 243*d* acquires the information on the status of the subject agent as the user and the item input to the service app of the user terminal from the service provision status information processor 233*a* of the service system client simulator 233. The app operation receiver 243*d* presents the acquired information to the real participant via the VR system, and receives an service app operation on the VR by the real participant. The app operation receiver 243*d* outputs the received service app operation on the VR by the real participant to the service usage information generator 233*b* of the service system client simulator 233.

4-4. Agent Simulator for Roadside Sensor Agent

Figure 18:
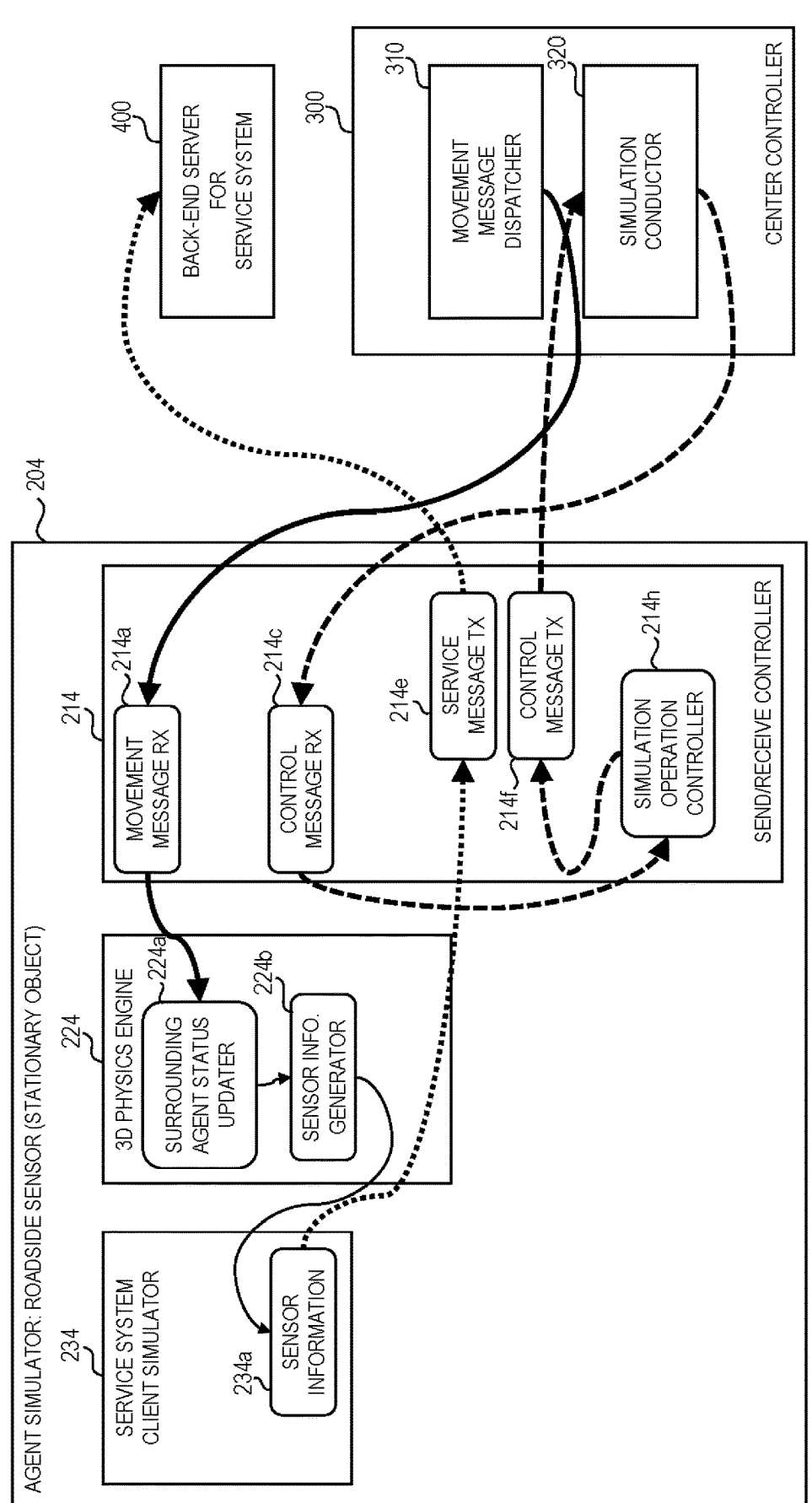
FIG. 18 is a block diagram showing a configuration of an agent simulator for a roadside sensor agent and information flow according to an embodiment of the present disclosure.

FIG. 18 is a block diagram showing a configuration of the agent simulator 204 for the roadside sensor agent and a flow of information. The roadside sensor agent is an agent corresponding to a roadside sensor used for acquiring position information of the autonomous robot/vehicle agent in the virtual world 2. The position information of the autonomous robot/vehicle agent acquired by the roadside sensor agent is used in the service system associated with the back-end server 400. Hereinafter, an overall configuration and details of each unit of the agent simulator 204 for the roadside sensor agent, and the flow of information in the agent simulator 204 will be described.

4-4-1. Overall Configuration of Agent Simulator for Roadside Sensor Agent

The agent simulator 204 includes, as its functions, a send/receive controller 214, a 3D physics engine 224, and a service system client simulator 234. These functions are conceptually included in the send/receive controllers 210, the 3D physics engine 220, and the simulator core 240, respectively. The agent simulator 204 does not include a simulator core unlike other agent simulators.

The send/receive controller 214 includes a movement message receiver 214*a* and a control message receiver 214*b* as functions for receiving a variety of messages. The send/receive controller 212 includes a service message sender 214*e* and a control message sender 214*f* as functions for sending a variety of messages. The send/receive controller 212 further includes a simulation operation controller 214*h*. Each of the units 214*a* to 214*h* constituting the send/receive controller 214 is a program or a part of a program.

The 3D physics engine 224 includes, as its functions, a surrounding agent status updater 224*a* and a sensor information generator 224*b*. Each of the units 224*a* and 224*b* constituting the 3D physics engine 224 is a program or a part of a program.

The service system client simulator 234 includes a service message generator 234*a* as a function thereof. The service message generator 234a constituting the service system client simulator 234 is a program or a part of a program.

4-4-2. Details of Send/Receive Controller

In the send/receive controller 214, the movement message receiver 214a receives the movement message from the movement message dispatcher 310. The movement message receiver 214a outputs the received movement message to the surrounding agent status updater 224a of the 3D physics engine 224.

The control message receiver 214c receives the simulation control message from the simulation conductor 320. The control message receiver 214c outputs the received simulation control message to the simulation operation controller 214h.

The service message sender 214e acquires the service message including sensor information from the service message generator 234a of the service system client simulator 234. The service message sender 214e sends the acquired service message to the back-end server 400.

The control message sender 214f acquires the simulation control message including the control status of the agent simulator 202 from the simulation operation controller 214h. The control message sender 214f sends the simulation control message acquired from the simulation operation controller 214h to the simulation conductor 320.

The simulation operation controller 214h acquires the simulation control message from the control message receiver 214c. The simulation operation controller 214h controls the simulation operation of the agent simulator 202 in accordance with an instruction included in the simulation control message. For example, when the change of the time granularity of the simulation is instructed, the simulation operation controller 214h changes the time granularity of the simulation by the agent simulator 202 from an initial value to the instructed time granularity. The initial value of the time granularity is stored as a set value in the agent simulator 204. An upper limit and a lower limit of the time granularity for each type of agent are stored in the simulation conductor 320.

When the instruction content of the simulation control message is the simulation speed, the simulation operation controller 214h accelerates or decelerates a computation speed of the agent simulator 204 by changing an operating frequency of the 3D physics engine 224 in accordance with the instructed simulation speed. When the stop of the simulation is instructed, the simulation operation controller 214h stops the simulation by the agent simulator 204. When the stop of the simulation is instructed, the simulation is stopped. When restart is instructed, the simulation is restarted. The simulation operation controller 214h outputs the simulation control message including the current control status of the agent simulator 204 to the control message sender 214f.

4-4-3. Details of 3D Physics Engine

In the 3D physics engine 224, the surrounding agent status updater 224a acquires the movement message from the movement message receiver 214a. The movement message acquired from the movement message receiver 214a is a movement message sent from another agent simulator via the movement message dispatcher 310. The surrounding agent status updater 224a estimates the current status of the surrounding agent existing around the subject agent based on the acquired movement message.

When the current status of the surrounding agent is estimated from the past status, the surrounding agent status updater 224a uses the past status of the surrounding agent stored in a log. The method of estimating the current status by the user of the past status of the surrounding agent is as described with reference to FIG. 3. The surrounding agent status updater 224a outputs the estimated current status of the surrounding agent to the sensor information generator 224b and updates the log.

The sensor information generator 224b acquires the current status of the surrounding agent from the surrounding agent status updater 224a. The sensor information generator 224b generates surroundings information acquired by observation from the subject agent, based on the current status of the surrounding agent. Since the subject agent is a stationary roadside sensor such as a camera, the surroundings information acquired by observation means sensor information captured by the roadside sensor. The sensor information generator 224b outputs the generated sensor information to the service message generator 234a of the service system client simulator 234.

4-4-4. Details of Service System Client Simulator

In the service system client simulator 234, the service message generator 234a acquires the sensor information from the sensor information generator 224b of the 3D physics engine 224. The service message generator 234a outputs the service message including the acquired sensor information to the service message sender 214e of the send/receive controller 214.

5. PHYSICAL CONFIGURATION OF MAS SYSTEM

Figure 19:
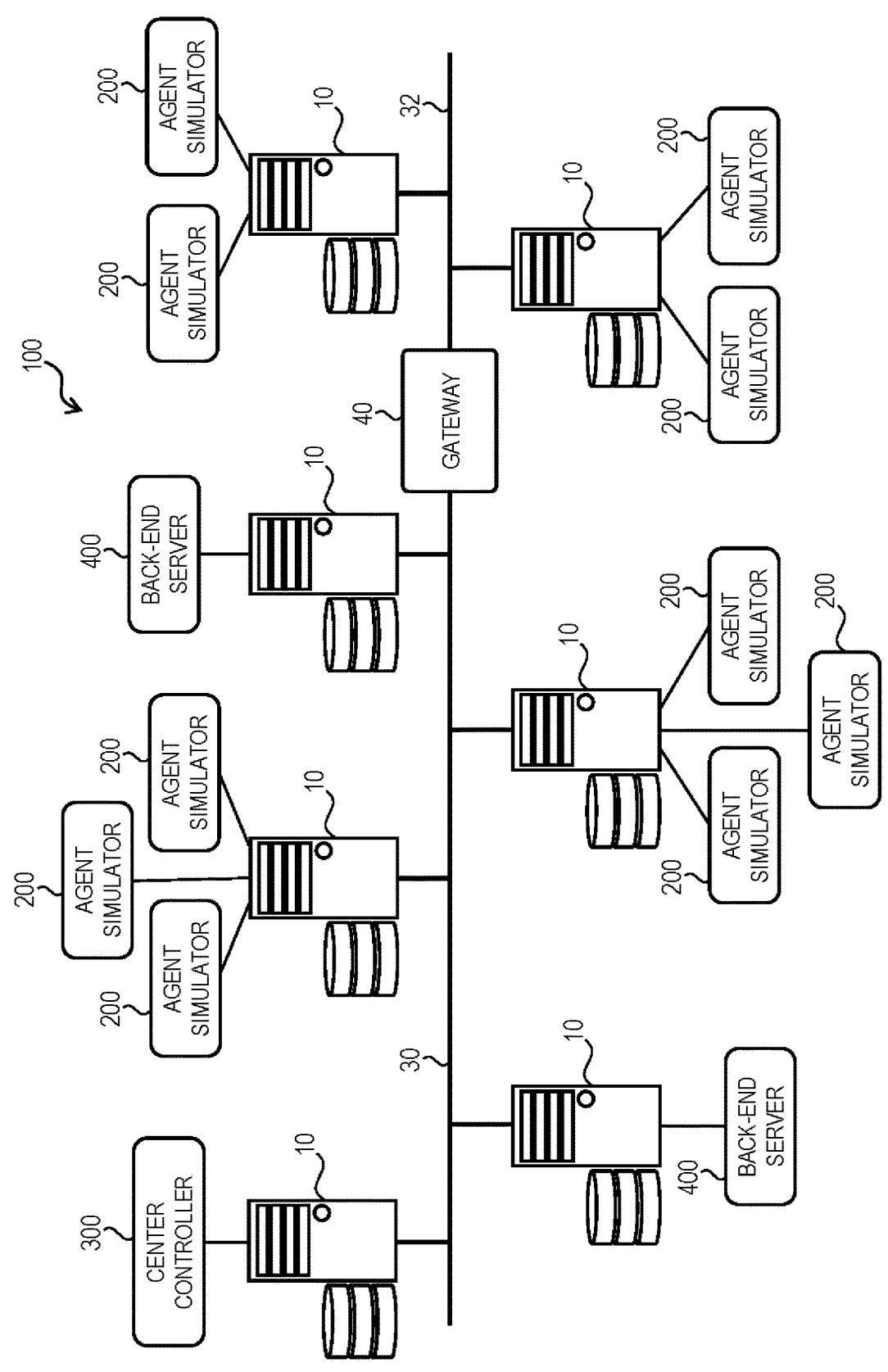
FIG. 19 is a diagram showing an example of a physical configuration of a multi-agent simulation system according to an embodiment of the present disclosure.

A physical configuration of the MAS system 100 will be described. FIG. 19 is a diagram showing an example of the physical configuration of the MAS system 100. For example, the MAS system 100 is constituted by a plurality of computers 10 arranged on a same subnet 30. Moreover, connecting the subnet 30 and another subnet 32 via a gateway 40 makes it possible to expand the MAS system 100 to a plurality of computers 10 arranged on the subnet 32.

In the example shown in FIG. 19, the center controller 300, which is software, is installed on a single computer 10. It should be noted that the functions of the center controller 300 may be distributed to a plurality of computers 10.

Furthermore, the MAS system 100 includes a plurality of back-end servers 400. In the example shown in FIG. 19, the back-end servers 400 are installed on different computers 10, respectively. It should be noted that the functions of the back-end server 400 may be distributed to a plurality of computers 10. As another example, the plurality of back-end servers 400 may be installed on a single computer 10 by utilizing a virtualization technology that divides one server into a plurality of servers.

In the example shown in FIG. 19, a plurality of agent simulators 200 are installed on a single computer 10. The virtualization technology can be used as a method of independently operating the plurality of agent simulators 200 on the single computer 10. The virtualization technology may be a virtual machine or may be a container-based virtualization. A plurality of agent simulators 200 of the same type may be installed on the single computer 10, or a plurality of agent simulators 200 of different types may be installed on the single computer 10. It should be noted that only one agent simulator 200 may be installed on the single computer 10.

As described above, the MAS system 100 employs parallel distributed processing using a plurality of computers 10 rather than processing by a single computer. It is thus possible to prevent the number of agents in the virtual world 2 from being limited due to lack of a processing capacity of the computer, and to prevent the number of services provided in the virtual world 2 from being limited due to lack of a processing capacity of the computer. That is, according to the MAS system 100, a large-scale simulation by the parallel distributed processing is possible.

6. OTHERS

A monitoring agent for monitoring the virtual world 2 from the outside may be provided. The monitoring agent may be a stationary object such as a street camera, or may be a moving object such as a drone provided with a camera.

What is claimed is:

1. A multi-agent simulation system that performs a simulation of a target world in which a plurality of agents interacting with each other exist, the multi-agent simulation system comprising a plurality of computers connected by a network and executing software to implement:

a plurality of agent simulators configured to perform simulations of the plurality of agents, respectively; and a center controller configured to communicate with the plurality of agent simulators, wherein a subject agent is the agent allocated for each of the plurality of agent simulators, the center controller is further configured to deliver at least one delivery message indicating a status of at least one another agent different from the subject agent to the each agent simulator, the each agent simulator is configured to:

determine a status of the subject agent by performing a simulation of the subject agent based on the status of said another agent indicated by the delivery message; and send a result message indicating the status of the subject agent acquired as a result of the simulation to the center controller, the center controller is further configured to deliver the result message received from the each agent simulator as a new delivery message, the plurality of agent simulators include:

a first agent simulator that performs a simulation of a first agent at a first processing time interval; and a second agent simulator that performs a simulation of a second agent different from the first agent at a second processing time interval longer than the first processing time interval, and the center controller is further configured to set a number of a second delivery message delivered to the second agent simulator per unit time to be smaller than a number of a first delivery message delivered to the first agent simulator per unit time, wherein the first agent simulator sends a first result message regarding the first agent to the center controller at a first frequency corresponding to the first processing time interval, the center controller is configured to select only a part of first result messages received from the first agent simulator as the second delivery message, and to deliver the second delivery message selected to the second agent simulator, and the center controller is further configured to select the second delivery message so as to include at least a latest first result message received before a timing at which the second agent simulator determines the status of the second agent.

2. The multi-agent simulation system according to claim 1, wherein the center controller delivers the second delivery message to the second agent simulator at a second frequency that corresponds to the second processing time interval and is lower than the first frequency.

3. The multi-agent simulation system according to claim 1, wherein the center controller includes software executed to implement a plurality of message filters provided for the plurality of agent simulators, respectively, and the plurality of message filters are configured to adjust numbers of delivery messages to be delivered to the plurality of agent simulators, respectively.

4. The multi-agent simulation system according to claim 3, wherein the plurality of message filters includes:

a first message filter configured to adjust a number of the first delivery message to be delivered to the first agent simulator based on information of the first processing time interval; and a second message filter configured to adjust a number of the second delivery message to be delivered to the second agent simulator based on information of the second processing time interval.

5. The multi-agent simulation system according to claim 1, wherein the center controller is further configured to select the second delivery message so as to include a latest two first result messages received before a timing at which the second agent simulator determines the status of the second agent.

\* \* \* \* \*